US012720891B2

(12) United States Patent
Yamagishi et al.

(10) Patent No.: US 12,720,891 B2
(45) Date of Patent: Aug. 25, 2026

(54) IMAGING ELEMENT AND ELECTRONIC APPARATUS

(71) Applicant: SONY SEMICONDUCTOR SOLUTIONS CORPORATION, Kanagawa (JP)

(72) Inventors: Ichiro Yamagishi, Kanagawa (JP); Yasushi Maruyama, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 405 days.

(21) Appl. No.: 18/551,638

(22) PCT Filed: Jan. 26, 2022

(86) PCT No.: PCT/JP2022/002777
§ 371 (c)(1),
(2) Date: Sep. 21, 2023

(87) PCT Pub. No.: WO2022/209226
PCT Pub. Date: Oct. 6, 2022

(65) Prior Publication Data

US 2024/0178250 A1 May 30, 2024

(30) Foreign Application Priority Data

Mar. 31, 2021 (JP) ................................. 2021-059271

(51) Int. Cl.
*H10F 39/00* (2025.01)
*H04N 25/702* (2023.01)
*H04N 25/77* (2023.01)

(52) U.S. Cl.
CPC ......... *H10F 39/806* (2025.01); *H04N 25/702* (2023.01); *H04N 25/77* (2023.01); *H10F 39/024* (2025.01)

(58) Field of Classification Search
CPC ...... H10F 39/806; H10F 39/024; H10F 39/12; H10F 39/8053; H10F 39/8063; H04N 25/702; H04N 25/77; G02B 5/30
See application file for complete search history.

(56) References Cited

U.S. PATENT DOCUMENTS

2012/0169910 A1* 7/2012 Singh .................... G02B 26/00 348/E5.091
2015/0256733 A1* 9/2015 Kanamori ............ G02F 1/0136 348/234

(Continued)

FOREIGN PATENT DOCUMENTS

JP 2012-109815 6/2012
JP 2018-500584 1/2018

(Continued)

OTHER PUBLICATIONS

International Search Report and Written Opinion prepared by the Japan Patent Office on Mar. 8, 2022, for International Application No. PCT/JP2022/002777, 3 pgs.

*Primary Examiner* — Nhan T Tran
(74) *Attorney, Agent, or Firm* — SHERIDAN ROSS P.C.

(57) ABSTRACT

The present technology relates to an imaging element capable of keeping uniformity of an extinction ratio in a plane, and an electronic apparatus. Provided is a pixel array unit in which a pixel, which includes a polarization member having a polarization direction, and a photoelectric conversion unit configured to receive light transmitted through the polarization member, is disposed in a row direction and a column direction to form a lattice pattern, and an orientation angle of the polarization member varies depending on a position of the pixel array unit. Provided are a polarization member formed by a wire grid having a polarization direction, and a photoelectric conversion unit configured to receive light transmitted through the polarization member, (Continued)

and the wire grid is formed in a curved shape. The present technology can be applied to, for example, an imaging element that acquires polarization information.

15 Claims, 22 Drawing Sheets

(56) References Cited

U.S. PATENT DOCUMENTS

| | | | | |
|---|---|---|---|---|
| 2017/0068029 | A1* | 3/2017 | Yun | G02B 27/283 |
| 2017/0214863 | A1 | 7/2017 | Narabu | |
| 2018/0075615 | A1* | 3/2018 | Myokan | G06T 7/557 |

FOREIGN PATENT DOCUMENTS

| | | | | |
|---|---|---|---|---|
| WO | WO 2016/009707 | | 1/2016 | |
| WO | WO 2019/176209 | | 9/2019 | |
| WO | WO-2019176209 | A1 * | 9/2019 | H04N 25/70 |
| WO | WO 2020/054152 | | 3/2020 | |
| WO | WO 2020/213238 | | 10/2020 | |

* cited by examiner

Figure 2:
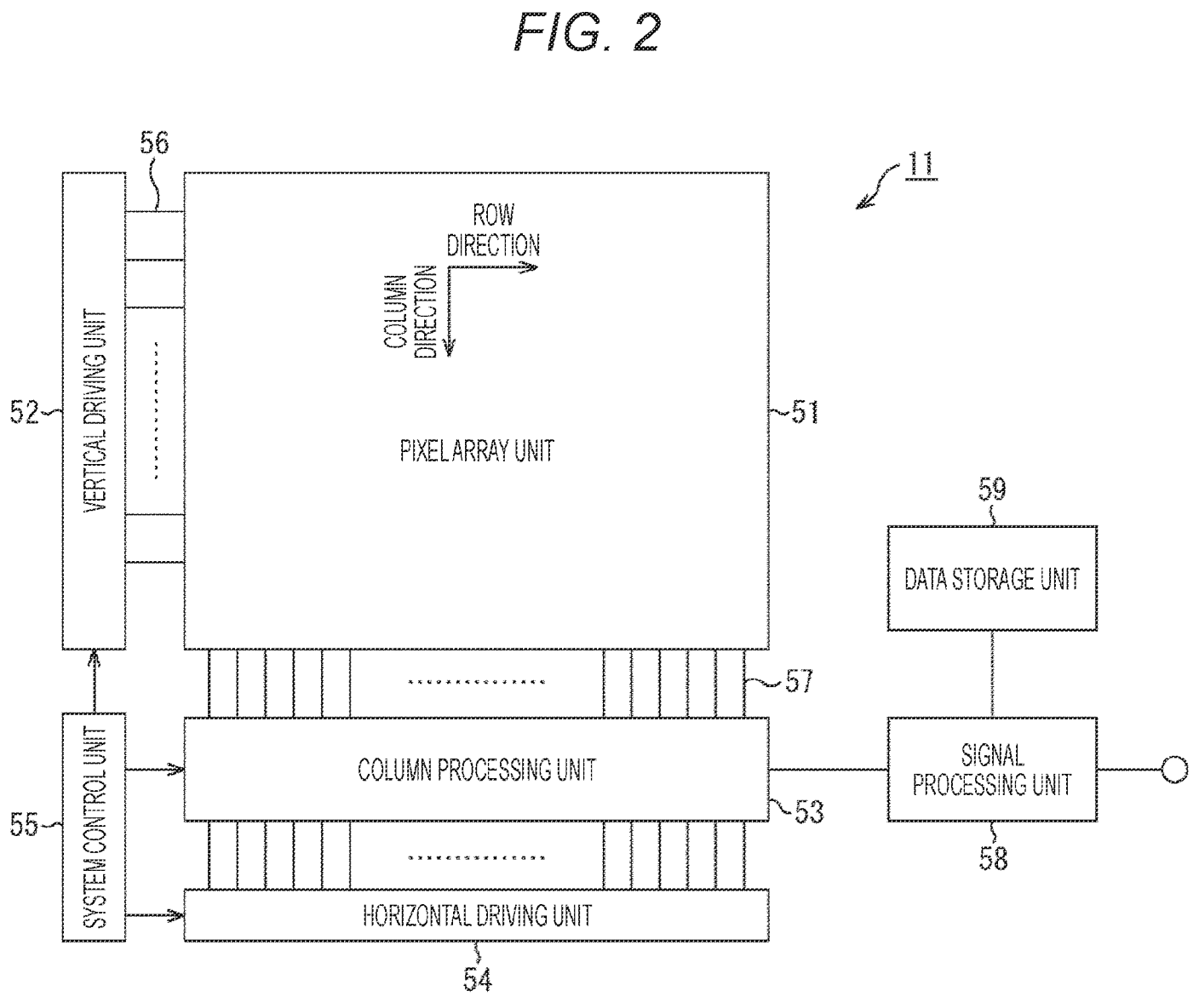

PIXEL ARRAY UNIT 51
ROW DIRECTION
COLUMN DIRECTION
VERTICAL DRIVING UNIT 52
COLUMN PROCESSING UNIT 53
HORIZONTAL DRIVING UNIT 54
SYSTEM CONTROL UNIT 55
56
57
SIGNAL PROCESSING UNIT 58
DATA STORAGE UNIT 59

Figure 21:
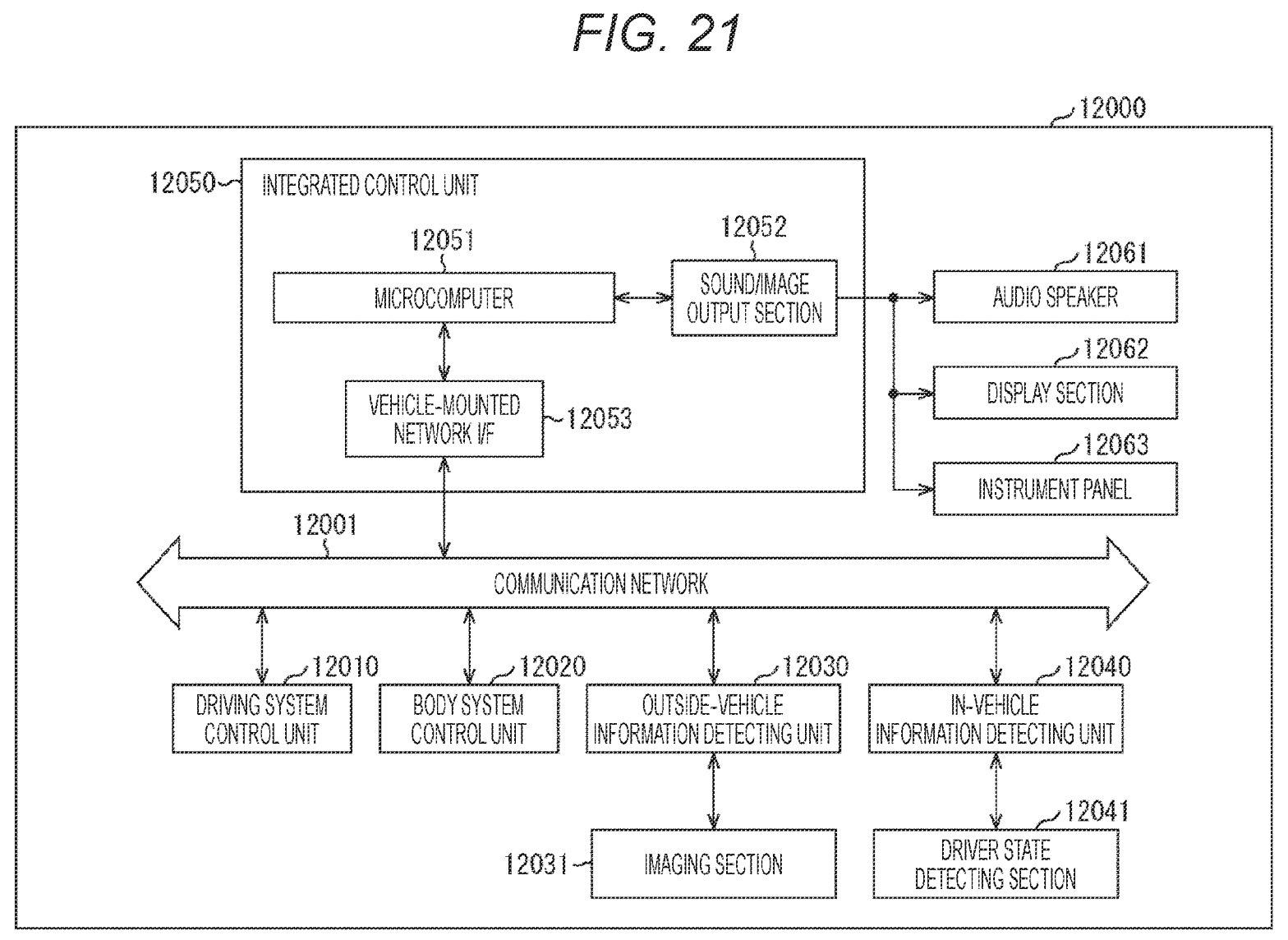

12000
12050 INTEGRATED CONTROL UNIT
12051 MICROCOMPUTER
12052 SOUND/IMAGE OUTPUT SECTION
12053 VEHICLE-MOUNTED NETWORK I/F
12061 AUDIO SPEAKER
12062 DISPLAY SECTION
12063 INSTRUMENT PANEL
12001 COMMUNICATION NETWORK
12010 DRIVING SYSTEM CONTROL UNIT
12020 BODY SYSTEM CONTROL UNIT
12030 OUTSIDE-VEHICLE INFORMATION DETECTING UNIT
12031 IMAGING SECTION
12040 IN-VEHICLE INFORMATION DETECTING UNIT
12041 DRIVER STATE DETECTING SECTION

IMAGING ELEMENT AND ELECTRONIC APPARATUS

CROSS REFERENCE TO RELATED APPLICATIONS

This application is a national stage application under 35 U.S.C. 371 and claims the benefit of PCT Application No. PCT/JP2022/002777, having an international filing date of 26 Jan. 2022, which designated the United States, which PCT application claimed the benefit of Japanese Patent Application No. 2021-059271, filed 31 Mar. 2021, the entire disclosures of each of which are incorporated herein by reference.

TECHNICAL FIELD

The present technology relates to an imaging element and an electronic apparatus, and for example, relates to an imaging element suitable for use in selectively acquiring an optical component, and an electronic apparatus.

BACKGROUND ART

A polarization camera that includes a polarization filter mounted on a sensor to acquire polarization information of a subject has been put into practical use. By using the polarization camera, information regarding a surface orientation of the subject and the presence of a transparent object can be acquired. Therefore, object identification and foreign object detection are easily performed. Patent Document 1 proposes an imaging element capable of acquiring polarization information in an easy manufacturing process.

CITATION LIST

Patent Document

Patent Document 1: Japanese Patent Application Laid-Open No. 2012-109815

SUMMARY OF THE INVENTION

Problems to be Solved by the Invention

There is a possibility that the image height of the sensor degrades polarization performance (extinction ratio). Since the non-uniformity of the polarization performance occurs in the sensor, the performance of the sensor is deteriorated. Therefore, it is desired to make the polarization performance uniform in the sensor.

The present technology has been made in view of such a situation, and an object of the present technology is to uniformize polarization performance in a sensor.

Solutions to Problems

According to an aspect of the present technology, there is provided a first imaging element including a pixel array unit in which a pixel, which includes a polarization member having a polarization direction, and a photoelectric conversion unit configured to receive light transmitted through the polarization member, is disposed in a row direction and a column direction to form a lattice pattern, in which an orientation angle of the polarization member varies depending on a position of the pixel array unit.

According to another aspect of the present technology, there is provided a first electronic apparatus including: an imaging element including a pixel array unit in which a pixel, which includes a polarization member having a polarization direction, and a photoelectric conversion unit configured to receive light transmitted through the polarization member, is disposed in a row direction and a column direction to form a lattice pattern, in which an orientation angle of the polarization member varies depending on a position of the pixel array unit; and a processing unit configured to process a signal from the imaging element.

According to still another aspect of the present technology, there is provided a second imaging element including: a polarization member formed by a wire grid having a polarization direction; and a photoelectric conversion unit configured to receive light transmitted through the polarization member, in which the wire grid is formed in a curved shape.

According to still another aspect of the present technology, there is provided a second electronic apparatus including: an imaging element including a polarization member formed by a wire grid having a polarization direction, and a photoelectric conversion unit configured to receive light transmitted through the polarization member, in which the wire grid is formed in a curved shape; and a processing unit configured to process a signal from the imaging element.

The first imaging element according to the aspect of the present technology includes a pixel array unit in which a pixel, which includes a polarization member having a polarization direction, and a photoelectric conversion unit configured to receive light transmitted through the polarization member, is disposed in a row direction and a column direction to form a lattice pattern, in which an orientation angle of the polarization member varies depending on a position of the pixel array unit.

The first electronic apparatus according to the aspect of the present technology includes the first imaging element.

The second imaging element according to the aspect of the present technology includes: a polarization member formed by a wire grid having a polarization direction; and a photoelectric conversion unit configured to receive light transmitted through the polarization member, in which the wire grid is formed in a curved shape.

The second electronic apparatus according to the aspect of the present technology includes the second imaging element.

BRIEF DESCRIPTION OF DRAWINGS

FIG. 2 is a diagram for describing a configuration example of an imaging element.

FIG. 3 is a diagram for describing a cross-sectional configuration example of an imaging element.

FIG. 21 is a block diagram illustrating an example of a schematic configuration of a vehicle control system.

MODE FOR CARRYING OUT THE INVENTION

Hereinafter, a mode for carrying out the present technology (hereinafter, referred to as an embodiment) will be described.

<Configuration of Imaging Device>

The present technology can be applied to an imaging device including an imaging element such as a charge coupled device (CCD) sensor or a complementary metal oxide semiconductor (CMOS) image sensor. Furthermore, the present technology can also be applied to a device including such an imaging device, for example, a mobile terminal device.

Figure 1:
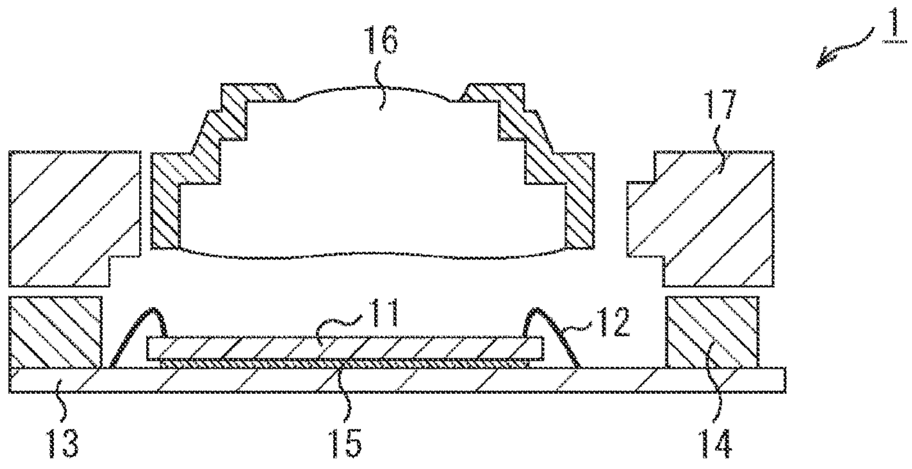
FIG. 1 is a diagram for describing a cross-sectional configuration example of an imaging device.

FIG. 1 is a diagram illustrating a configuration of an embodiment of an imaging device according to an aspect of the present technology. An imaging device 1 illustrated in FIG. 1 includes an imaging element 11 such as a CCD sensor or a CMOS image sensor that photoelectrically converts subject light from a subject and captures an image.

The imaging device 1 includes a lens 16 that condenses subject light. Furthermore, the imaging device 1 also includes an actuator 17 that drives the lens in a vertical direction (hereinafter, referred to as a Z-axis direction) with respect to the imaging element 11 in order to focus the lens 16.

The actuator 17 also has a function of performing correction to reduce the influence of hand shake by being driven in a direction (hereinafter, appropriately referred to as an X-axis direction or a Y-axis direction) of a plane (hereinafter, appropriately referred to as an XY plane) horizontal with respect to the imaging surface of the imaging element 11.

The imaging device 1 includes a metal wire 12 for electrically connecting the imaging element 11 with a circuit board 13, an adhesive 15 for fixing the imaging element 11 to the circuit board 13, and a spacer 14 for fixing the actuator 17 to the circuit board 13.

<Configuration of Imaging Element>

FIG. 2 is a diagram illustrating a configuration example of the imaging element 11. The imaging element 11 includes a pixel array unit 51 formed on a semiconductor substrate (chip) and a peripheral circuit unit integrated on the same semiconductor substrate as the pixel array unit 51. The peripheral circuit unit is configured by, for example, a vertical driving unit 52, a column processing unit 53, a horizontal driving unit 54, and a system control unit 55.

The imaging element 11 further includes a signal processing unit 58 and a data storage unit 59. The signal processing unit 58 and the data storage unit 59 may be mounted on the same substrate as the imaging element 11, or may be disposed on a substrate separately from the imaging element 11. The processing of the signal processing unit 58 and the processing of the data storage unit 59 may respectively be processing performed by an external signal processing unit provided on a substrate separately from the imaging element 11, for example, processing performed by a digital signal processor (DSP) circuit or software.

The pixel array unit 51 has a configuration in which a plurality of unit pixels (hereinafter, it may be simply referred to as "pixel") is disposed in a row direction and a column direction (XY plane). Here, the row direction refers to an arrangement direction of the pixels in a pixel row (that is, a horizontal direction), and the column direction refers to an arrangement direction of the pixel in a pixel column (that is, a vertical direction). More specifically, as will be described later, in the pixel array unit 51, the unit pixels (hereinafter, referred to as polarization pixels) capable of detecting polarization information are disposed. As will be described later with reference to FIG. 3, and the like, the polarization pixels are arranged in a lattice pattern (matrix pattern) in the row direction and the column direction.

Each of the unit pixels includes a photoelectric conversion unit (for example, a photodiode) that generates and accumulates a charge corresponding to the received light amount, and a plurality of pixel transistors (so-called MOS transistors). A plurality of the pixel transistors may include three transistors, for example, a transfer transistor, a reset transistor, and an amplification transistor. Alternatively, a plurality of the pixel transistors may include four transistors by adding a selection transistor. Note that an equivalent circuit of each unit pixel is similar to a general equivalent circuit, and thus detailed description will be omitted herein.

The unit pixel may have a shared pixel structure. The shared pixel structure includes a plurality of photoelectric conversion elements, a plurality of transfer transistors, one shared floating diffusion, and another pixel transistor shared by each of the transistors described above.

In the pixel array unit 51, a pixel drive line 56 as a row signal line is wired for each pixel row in the row direction, and a vertical signal line 57 as a column signal line is wired for each pixel column in the column direction. The pixel drive line 56 transmits a drive signal for performing driving to read a signal from a pixel. Note that in FIG. 2, the pixel drive line 56 is illustrated as one wire but is not limited to one. One end of the pixel drive line 56 is connected to an output end corresponding to each row of the vertical driving unit 52.

The vertical driving unit 52 includes a shift register and an address decoder, and drives the pixels of the pixel array unit 51 at the same time for all the pixels or in units of rows. That is, the vertical driving unit 52 constitutes a driving unit that controls operation of each pixel of the pixel array unit 51 together with the system control unit 55 that controls the vertical driving unit 52. Although a specific configuration of the vertical driving unit 52 is not illustrated, the vertical driving unit 52 generally includes two scanning systems of a read scanning system and a sweep scanning system.

The read scanning system selectively scans the unit pixels in the pixel array unit 51 sequentially in units of rows in order to read signals from the unit pixels. Each of the signals read from the unit pixels is an analog signal. The sweep scanning system performs sweep scanning on a read row on which the read scanning is to be performed by the read scanning system earlier than the read scanning by an exposure time.

When the sweep scanning is performed by the sweep scanning system, an unnecessary charge is swept from the photoelectric conversion unit of the unit pixel in the read row. Therefore, the photoelectric conversion unit is reset. Then, when the unnecessary charge is swept (reset) by the sweep scanning system, a so-called electronic shutter operation is performed. Here, the electronic shutter operation refers to operation of discharging the charge of the photoelectric conversion unit and newly starting exposure (starting accumulation of the charge).

The signal read by the read operation of the read scanning system corresponds to the received light amount after the immediately preceding read operation or electronic shutter operation. Then, a period from a read timing in the immediately preceding read operation or a sweep timing in the electronic shutter operation to a read timing in the current read operation is an exposure period of the charge in the unit pixel.

The signal output from each unit pixel in the pixel row selectively scanned by the vertical driving unit 52 is input to the column processing unit 53 through each of the vertical signal lines 57 for each pixel column. The column processing unit 53 performs, for each pixel column of the pixel array unit 51, a predetermined signal processing on the signal output through the vertical signal line 57 from the unit pixel in a selected row, and temporarily holds the pixel signal which have been subjected to the signal processing.

Specifically, the column processing unit 53 performs, as signal processing, at least noise removal processing, for example, correlated double sampling (CDS) processing or double data sampling (DDS) processing. For example, in the CDS processing, fixed pattern noise unique to the pixel, such as reset noise or threshold variation of the amplification transistor in the pixel, is removed. The column processing unit 53 may have, for example, an analog-digital (AD) conversion function in addition to the noise removal processing, and convert an analog pixel signal into a digital signal and output the digital signal.

The horizontal driving unit 54 includes a shift register and an address decoder, and sequentially selects a unit circuit corresponding to each pixel column in the column processing unit 53. When the selective scanning is performed by the horizontal driving unit 54, the pixel signal subjected to the signal processing for each unit circuit in the column processing unit 53 is sequentially output.

The system control unit 55 includes a timing generator that generates various timing signals, and performs drive control for the vertical driving unit 52, the column processing unit 53, the horizontal driving unit 54, and the like on the basis of various timings generated by the timing generator.

The signal processing unit 58 has at least an arithmetic processing function, and performs various signal processing such as arithmetic processing on the pixel signal output from the column processing unit 53. The data storage unit 59 temporarily stores data necessary for signal processing when the signal processing is performed by the signal processing unit 58.

<Cross-Sectional Configuration Example of Imaging Element>

Figure 3:
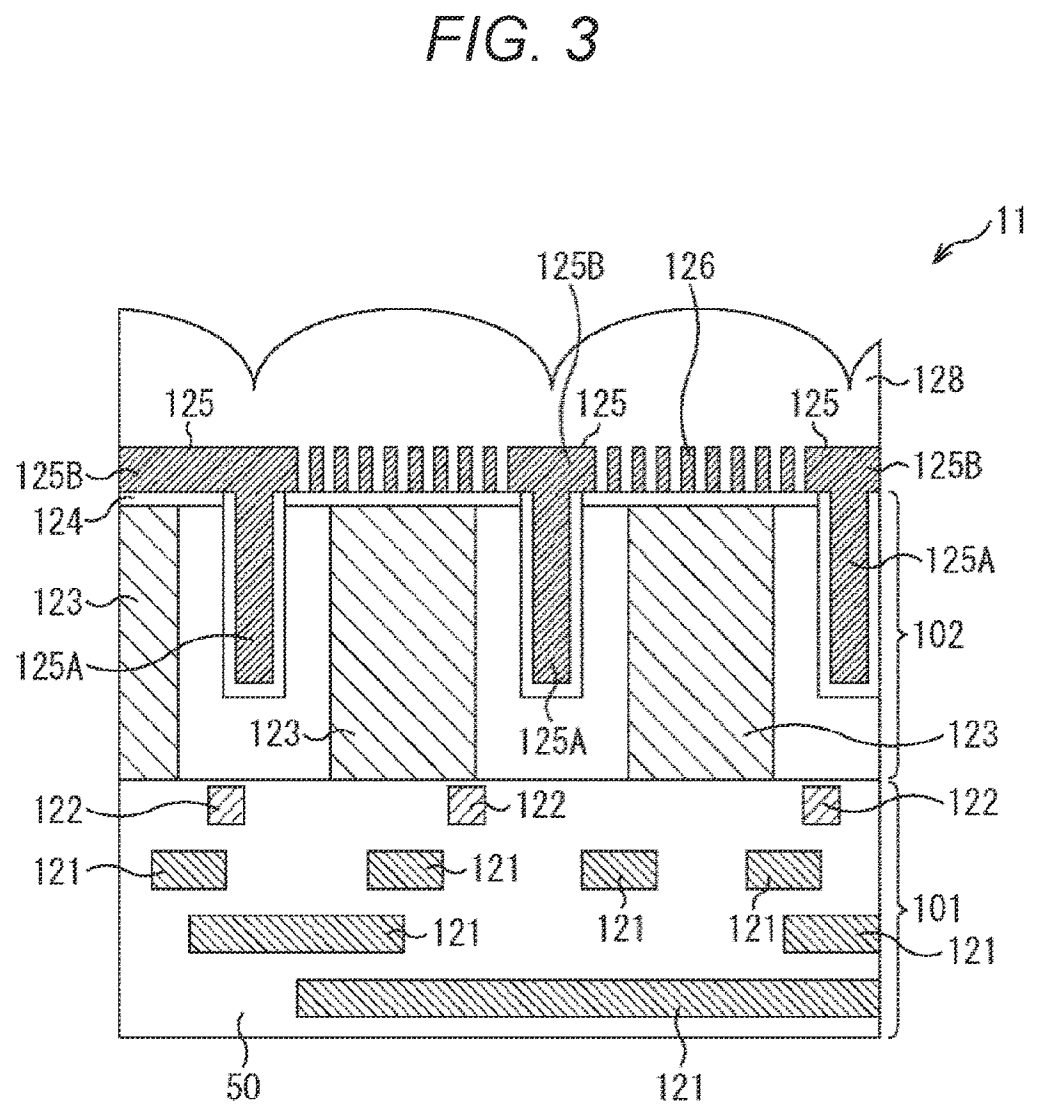

FIG. 3 is a cross-sectional view schematically illustrating a configuration example of the imaging element 11. Hereinafter, a light incident side (upper side in FIG. 3) is defined as an upper side of the imaging element 11, and a side opposite to the light incident side (lower side in FIG. 3) is defined as a lower side of the imaging element 11. FIG. 3 illustrates pixels 50 disposed side by side.

The imaging element 11 has a so-called back-side illumination structure in which light is incident from a back surface side opposite to a front surface of a semiconductor substrate 102 on which a wiring layer 101 is stacked. Note that the back surface of the semiconductor substrate 102 is referred to as an incident surface or a light receiving surface.

In the wiring layer 101, wirings 121 are stacked over a plurality of layers. A gate electrode 122 is formed for each pixel near a boundary between the wiring layer 101 and the semiconductor substrate 102.

A photoelectric conversion element 123 is formed in the semiconductor substrate 102. A trench is formed between the photoelectric conversion elements 123 from the incident surface side of the semiconductor substrate 102. An insulation film 124 is formed on the incident surface of the semiconductor substrate 102 and a wall surface of the trench. A vertical portion 125A of a light shielding film 125 is embedded in the trench of the semiconductor substrate 102.

A horizontal portion 125B of the light shielding film 125 and a polarization member 126 are formed on the incident surface of the semiconductor substrate 102 via the insulation film 124. The horizontal portion 125B of the light shielding film 125 covers the incident surface of the semiconductor substrate 102, and an opening portion is formed above the photoelectric conversion element 123. That is, the horizontal portion 125B of the light shielding film 125 is formed so as to fill a space between adjacent pixels. The vertical portion 125A and horizontal portion 125B of the light shielding film 125 prevent light from adjacent pixels from being incident in an oblique direction.

The polarization member 126 is formed in the opening portion of the horizontal portion 125B of the light shielding film 125 above the photoelectric conversion element 123, and covers the upper surface (incident surface) of the photoelectric conversion element 123. The polarization member 126 is formed by, for example, a wire grid polarizer, and is formed with a plurality of band-like conductive light shielding materials to have a slit provided between the band-like conductive light shielding materials.

The polarization member 126 allows a polarized wave having an electric field component in a direction orthogonal to an extending direction of each of the conductive light shielding materials to pass through, and prevents a polarized wave having an electric field component parallel to the extending direction of each of the conductive light shielding materials from passing through. As the conductive light shielding material of the polarization member 126, for example, a conductor material having a small complex refractive index in a wavelength band in which the photoelectric conversion element 123 has sensitivity is used. As such a conductive material, for example, aluminum, copper, gold, silver, platinum, tungsten, or an alloy containing these metals can be considered.

A condensing element 128 is formed above the horizontal portion 125B of the light shielding film 125 and the polarization member 126 via an interlayer insulation film (not illustrated). The condensing element 128 is formed by, for example, an on-chip microlens, and condenses the incident light so as to be incident on the polarization member 126.

The light that has passed through the polarization member 126 is incident on the photoelectric conversion element 123 and is photoelectrically converted by the photoelectric conversion element 123. Then, an analog electric signal (polarization pixel signal) based on a charge generated in the photoelectric conversion is output to the column processing unit 53 via the vertical signal line 57.

Figure 4:
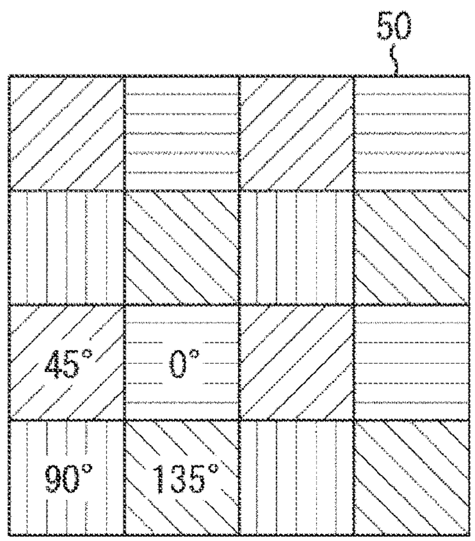
FIG. 4 is a diagram for describing a shape of a polarization member 126.

FIG. 4 is a diagram illustrating a configuration example of the polarization member 126. In FIG. 4, each quadrangle indicates one pixel 50. In the pixel array unit 51, the pixels 50 are disposed in the row direction and the column direction. In the disposing of the pixels 50, a block is set as one unit in which a 0° pixel, a 45° pixel, a 90° pixel, and a 135° pixel, which have angles different from each other by 45°, are disposed in two rows and two columns, and each block is periodically disposed in the row direction and column direction to form a lattice pattern (matrix pattern).

FIG. 4 illustrates 16 pixels 50 disposed in 4×4 (pixels 50 forming four blocks) in the pixel array unit 51, and among the pixels 50, the angles of a transmission axis are illustrated on the pixels 50 illustrated in the lower left of the drawing.

One block formed by four pixels 50 is configured by the pixels 50 respectively having the polarization members 126 of which transmission axes are set to 0°, 45°, 90°, and 135°, respectively.

FIG. 4 illustrates an example in which the polarization member 126 having the transmission axis of 45° is disposed in the pixel 50 disposed in the upper left of one block, and the polarization member 126 having the transmission axis of 0° is disposed in the pixel 50 disposed in the upper right of the block. Furthermore, the polarization member 126 having the transmission axis of 90° is disposed in the pixel 50 disposed in the lower left of the block, and the polarization member 126 having the transmission axis of 135° is disposed in the pixel 50 disposed in the lower right of the block. Each pixel 50 transmits light having a direction parallel to the transmission axis.

In the following description, the pixels 50 respectively having the polarization members 126 of which the angles of the transmission axes are 0°, 45°, 90°, and 135° are referred to as a 0° pixel, a 45° pixel, a 90° pixel, and a 135° pixel, respectively. Hereinafter, the angle of the transmission axis of the polarization member 126 is also appropriately referred to as a polarization angle.

In a case where a lower left vertex among four vertexes of a quadrangle representing the pixel 50 is an origin (0, 0), a horizontal direction in the drawing is an X axis, and a vertical direction in the drawing is a Y axis, the polarization angle of the transmission axis of the 0° pixel is 0°, and a wire grid forming the polarization member 126 is formed such that an angle formed with the X axis in the 0° pixel is 0°.

Similarly, the polarization angle of the transmission axis of the 45° pixel is 45°, and the wire grid forming the polarization member 126 is formed such that the angle formed with the X axis in the 45° pixel is 45°.

Similarly, the polarization angle of the transmission axis of the 90° pixel is 90°, and the wire grid forming the polarization member 126 is formed such that the angle formed with the X axis in the 90° pixel is 90°. Similarly, the polarization angle of the transmission axis of the 135° pixel is 135°, and the wire grid forming the polarization member 126 is formed such that the angle formed with the X axis in the 135° pixel is 135°.

Figure 5:
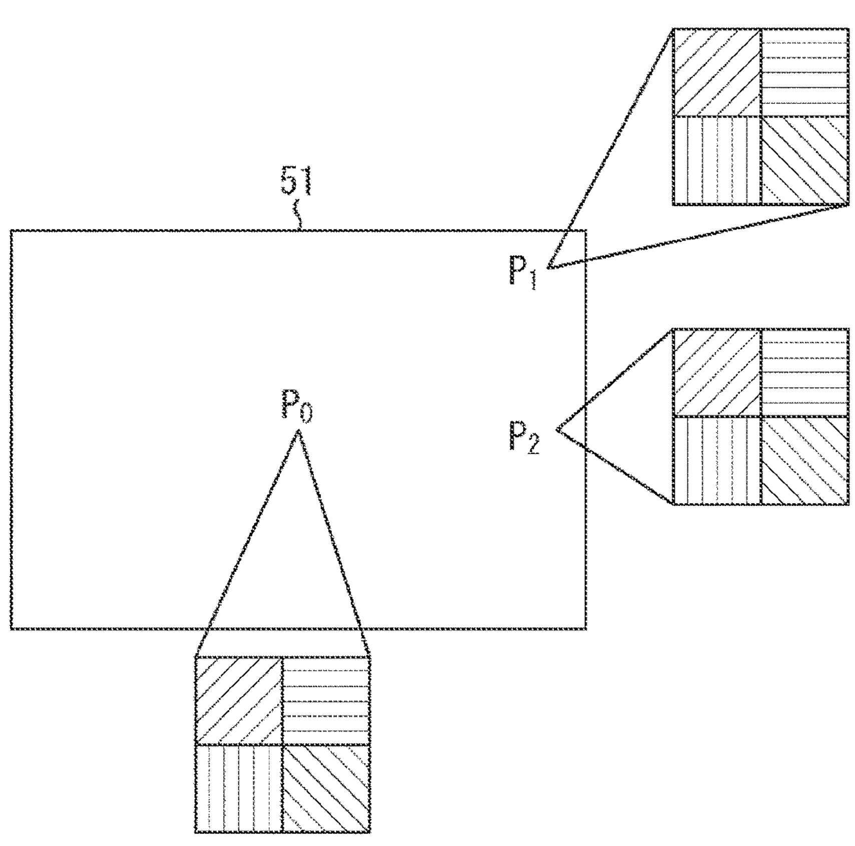
FIG. 5 is a diagram for describing a shape of a polarization member in the related art.

FIG. 5 illustrates the arrangement of the polarization member 126 disposed on the pixel array unit 51 in the related art. The polarization member 126 is uniformly disposed at the same polarization angle in any portion of the pixel array unit 51. For example, as illustrated in FIG. 5, the polarization member 126 disposed at a central portion P0 of the pixel array unit 51, the polarization member 126 disposed at an upper right portion P1, and the polarization member 126 disposed at a right-end central portion P2 have the same polarization angle of the transmission axis regardless of the position.

Figure 6:
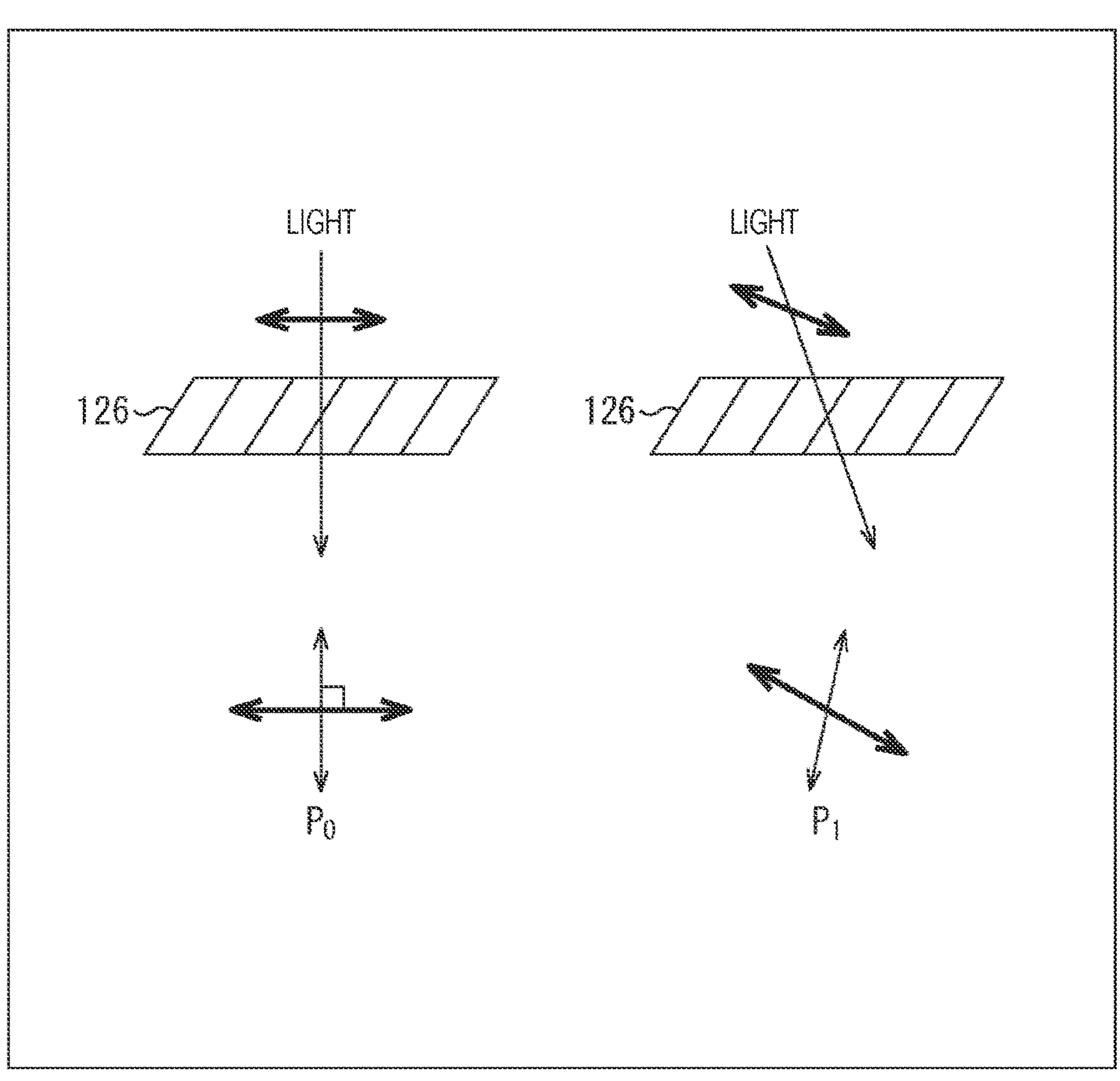
FIG. 6 is a diagram for describing a state in which a crossed-Nicols state is non-uniform.

Since the polarization angle of the polarization member 126 of the related art is uniformly formed regardless of the image height, as illustrated in FIG. 6, there is a possibility that the crossed-Nicols state collapses according to the position of the pixel array unit 51, and a part of light is transmitted, and the extinction ratio decreases.

In order to extract light having only a component in a predetermined direction with the polarization member 126, it is necessary to prevent the components other than the component in the predetermined direction from being transmitted. In order to prevent a component other than the component in the predetermined direction from being transmitted by the polarization member 126, it is necessary to dispose the transmission axis of the polarization member 126 such that the transmission axis of the polarization member 126 is orthogonal to the light having a component other than the component of the incident light in the predetermined direction to make the crossed-Nicols state. When the crossed-Nicols state collapses, light having a component other than the component to be extracted in a predetermined direction is also transmitted through the polarization member 126, and there is a possibility that the extinction ratio decreases.

The left side of FIG. 6 is a diagram illustrating a crossed-Nicols state in a case where light is incident on the polarization member 126 disposed at the central portion P0. FIG. 6 illustrates a case where light (hereinafter, referred to as linearly polarized light) transmitted through the polarization member 126 of which the angle of the transmission axis is 0° is incident as the incident light, and illustrates a case where the polarization member 126 has the polarization angle of the transmission axis of 90° (90° pixel).

As illustrated on the left side of FIG. 6, in a case where orthogonally polarized light is incident on the polarization member 126 of the 90° pixel disposed at the central portion P0 of the pixel array unit 51, the crossed-Nicols state is in an orthogonal relationship. Therefore, at the central portion P0 of the pixel array unit 51, the extinction ratio does not decrease since the crossed-Nicols state is maintained.

The right side of FIG. 6 is a diagram illustrating a crossed-Nicols state in a case where light is incident on the polarization member 126 of the 90° pixel disposed at the upper right portion P1. As illustrated on the right side of FIG. 6, in a case where orthogonally polarized light is incident on the polarization member 126 of the 90° pixel disposed at the upper right portion P1 of the pixel array unit 51, the orthogonally polarized light is incident on the polarization member 126 in an oblique direction. Therefore, when the orthogonally polarized light is incident on the polarization member 126, the orthogonally polarized light is incident at an angle. In such a case, the state in which the crossed-Nicols state is in the orthogonal relationship cannot be maintained, and the crossed-Nicols state collapses. When the crossed-Nicols state has collapsed, there is a possibility that light leakage occurs, and the extinction ratio decreases.

As in the related art, when an orientation angle (polarization angle) at which the wire grid of the polarization member 126 is formed in the pixel 50 is the same regardless of the image height, there is a possibility that the crossed-Nicols state collapses due to the orientation of the polarization in a portion where the image height is high, in other words, in a peripheral portion of the pixel array unit 51 on which light is obliquely incident.

The orientation angle of the wire grid of the polarization member 126 is changed according to the image height such that the crossed-Nicols state does not collapse even in the peripheral portion of the pixel array unit 51 on which light is obliquely incident. The angle (polarization angle) of the transmission axis is usually equivalent to the angle formed between the wire grid and the X axis, but in the embodiment to be described below, the angle formed between the wire grids with the X axis differs depending on the image height.

For example, the polarization angle of the 0° pixel is 0°, and the angle (orientation angle) formed between the wire grid and the X axis is 0°, but the angle (orientation angle) formed between the wire grid of the 0° pixel disposed at a position having a high image height and the X axis is not 0°.

In the following description, the angle formed between the X axis and the wire grid is appropriately described as an orientation angle. The description will be continued on the assumption that the polarization angle is the angle of the transmission axis, and is the angle of light desired to be transmitted. In the following description, the orientation angle may or may not coincide with the polarization angle.

Figure 7:
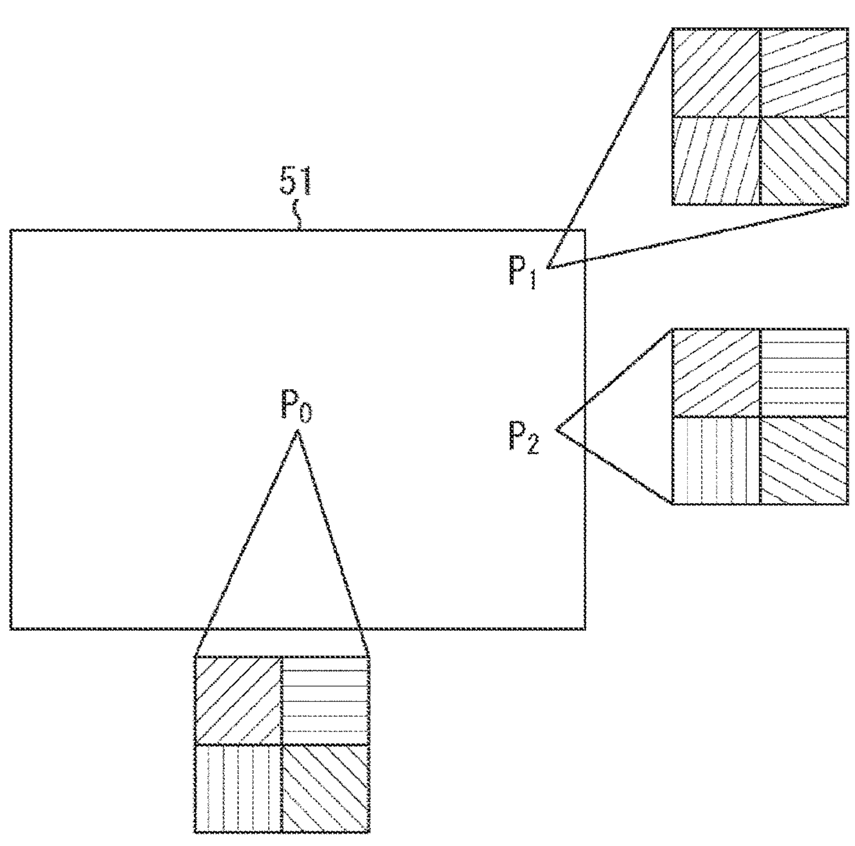
FIG. 7 is a diagram for describing a shape of a polarization member according to a first embodiment.

FIG. 7 illustrates an arrangement example of the polarization member 126 disposed on the pixel array unit 51 in the present embodiment. The orientation angle of the polarization member 126 is adjusted according to the image height of the pixel array unit 51 such that the crossed-Nicols state can be maintained.

In the example illustrated in FIG. 7, the polarization member 126 disposed at the central portion P0 of the pixel array unit 51 is formed in a state in which the orientation angle and the polarization angle coincide with each other. In a case where the polarization member 126 disposed at the central portion P0 of the pixel array unit 51 in which the orientation angle and the polarization angle coincide with each other is used as a reference, since the polarization member 126 disposed at the upper right portion P1 has a high image height, the shape (orientation angle) of the wire grid is adjusted such that the crossed-Nicols state can be maintained even at the image height.

Specifically, while the orientation angle of the wire grid of the 0° pixel disposed in the upper right of one block disposed at the central portion P0 is 0°, the orientation angle of the wire grid of the 0° pixel disposed in the upper right of one block disposed at the upper right portion P1 is an angle greater than 0°, and the wire grid is formed by a straight line inclined from the lower left to the upper right.

Similarly, while the orientation angle of the wire grid of the 90° pixel disposed in the lower left of one block disposed at the central portion P0 is 90°, the orientation angle of the wire grid of the 90° pixel disposed in the lower left of one block disposed at the upper right portion P1 is an angle smaller than 90°, and the wire grid is formed by a straight line inclined from the lower left to the upper right.

In the 45° pixel disposed in the upper left and the 135° pixel disposed in the lower right in one block disposed at the upper right portion P1, the polarization member 126 in which a wire grid having the same orientation angle as those of the 45° pixel disposed in the upper left and the 135° pixel disposed in the lower right in one block disposed at the central portion P0 is formed is disposed.

The polarization member 126 disposed at the right central portion P2 is referred to. Since the pixel 50 disposed at the right central portion P2 is disposed at a position where the image height is high, the orientation angle of the wire grid is adjusted such that the crossed-Nicols state can be maintained even at the image height.

Specifically, while the orientation angle of the 45° pixel disposed in the upper left of one block disposed at the central portion P0 is 45°, the orientation angle of the wire grid of the 45° pixel disposed in the upper left of one block disposed at the right central portion P2 is an angle smaller than 45°, and the wire grid is formed by a straight line having gentle inclination.

Similarly, while the orientation angle of the 135° pixel disposed in the lower right of one block disposed at the central portion P0 is 135°, the orientation angle of the wire grid of the 135° pixel disposed in the lower right of one block disposed at the right central portion P2 is an angle greater than 135°, and the wire grid is formed by a straight line having gentle inclination.

In the 0° pixel disposed in the upper right and the 90° pixel disposed in the lower left in one block disposed at the right central portion P2, the polarization member 126 in which a wire grid having the same orientation angle as those of the 0° pixel disposed in the upper left and the 90° pixel disposed in the lower right in one block disposed at the central portion P0 is formed is disposed.

As described above, the shape of the wire grid of the polarization member 126, specifically, the direction and degree of inclination of the wire grid, that is, the orientation angle of the wire grid is adjusted depending on the position in the pixel array unit 51. As described above, this adjustment is performed such that the crossed-Nicols state can be maintained.

Figure 8:
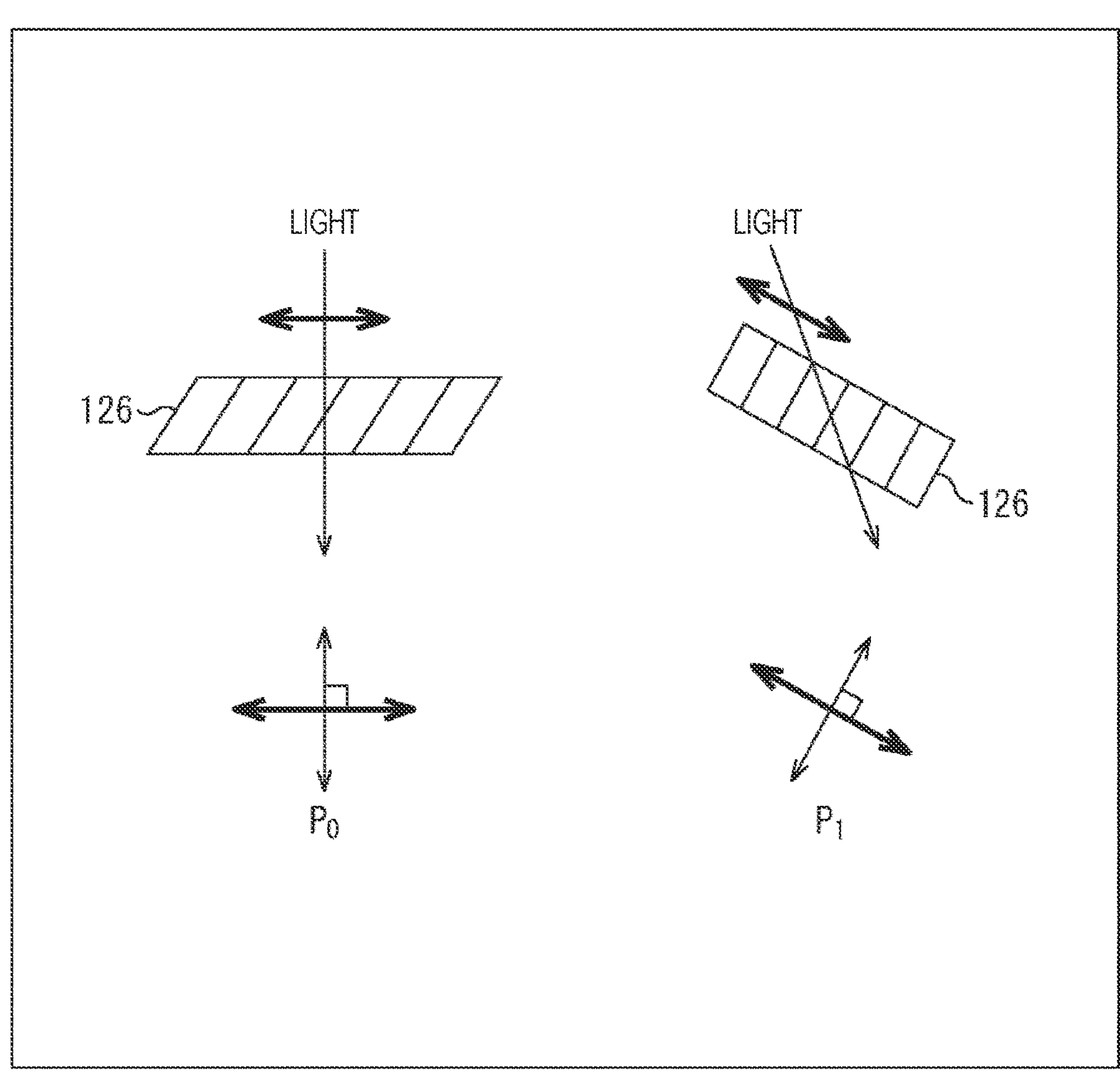
FIG. 8 is a diagram for describing improvement of a crossed-Nicols state.

By adjusting the orientation angle of the wire grid in this manner, a state in which the crossed-Nicols state can be maintained is obtained as described with reference to FIG. 8. The left side of FIG. 8 is a diagram illustrating a crossed-Nicols state in a case where light is incident on the polarization member 126 disposed at the central portion P0. At the central portion P0, the orientation angle of the polarization member 126 is formed to coincide with the polarization angle, and the crossed-Nicols state is also maintained.

The right side of FIG. 8 is a diagram illustrating a crossed-Nicols state in a case where light is incident on the polarization member 126 of the 90° pixel disposed at the upper right portion P1. As illustrated in the right side of FIG. 8, the orientation angle of the polarization member 126 of the 90° pixel disposed at the upper right portion P1 of the pixel array unit 51 is an angle adjusted to maintain the crossed-Nicols state as described with reference to FIG. 7.

The angle adjusted to maintain the crossed-Nicols state includes an angle in a state in which the crossed-Nicols state is completely maintained and an angle in a state slightly deviated from the crossed-Nicols state. The description will be continued on the assumption that the angle adjusted to maintain the crossed-Nicols state is an angle having a width, and is an angle including an angle slightly deviated from the angle at which the crossed-Nicols state is completely maintained.

As illustrated on the right side of FIG. 8, in a case where orthogonally polarized light is incident on the polarization member 126 of the 90° pixel disposed at the upper right portion P1, the orthogonally polarized light is incident on the polarization member 126 in an oblique direction. Therefore, when the orthogonally polarized light is incident on the polarization member 126, the orthogonally polarized light is incident at an angle. Even in such a case, since the orientation angle of the wire grid is adjusted such that the crossed-Nicols state is in the orthogonal relationship, the crossed-Nicols state is maintained. Therefore, even at a position where the image height is high, the crossed-Nicols state is maintained, light leakage is suppressed, and a decrease in the extinction ratio can be prevented.

Figure 9:
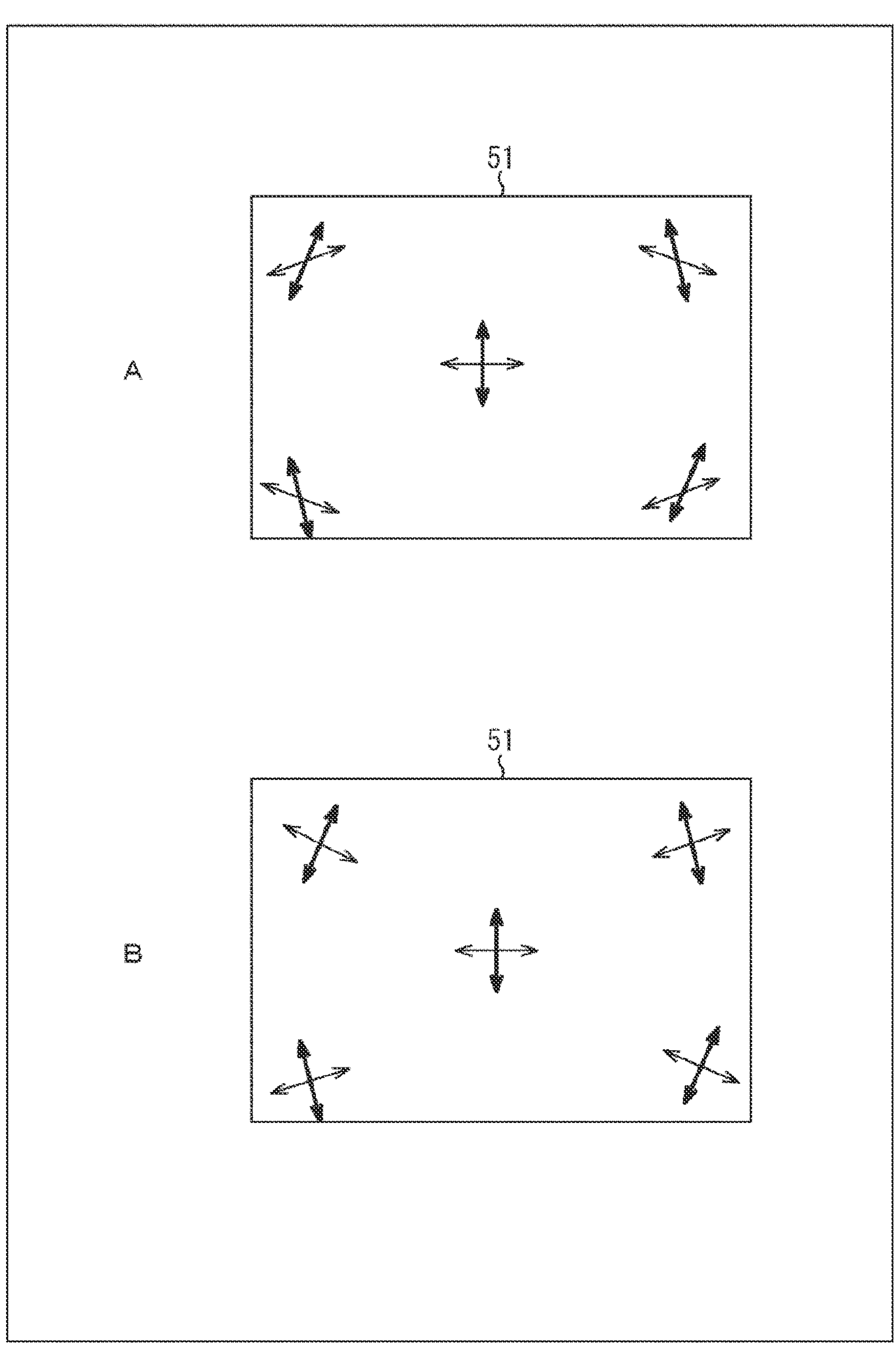
FIG. 9 is a diagram for describing a state in which a crossed-Nicols state is non-uniform.

A of FIG. 9 illustrates an example of the crossed-Nicols state in the pixel array unit 51 in the related art, and B of FIG. 9 illustrates an example of the crossed-Nicols state after adjustment.

As described with reference to FIG. 5 and FIG. 6, in a case where the inclination direction and inclination degree of the transmission axis of the polarization member 126 on the pixel array unit 51 are made uniform, as illustrated in A of FIG. 9, the collapse of the crossed-Nicols state particularly increases at four corners of the pixel array unit 51.

As described with reference to FIG. 7 and FIG. 8, by adjusting the inclination direction and inclination degree of the transmission axis of the polarization member 126 on the pixel array unit 51 according to the position of the pixel array unit 51, that is, according to the image height, as illustrated in B of FIG. 9, it is possible to maintain the crossed-Nicols state at four corners of the pixel array unit 51 as at the central portion of the pixel array unit 51. Therefore, the crossed-Nicols state in the pixel array unit 51 can be made uniform, and a region in which the extinction ratio decreases can be removed.

Figure 10:
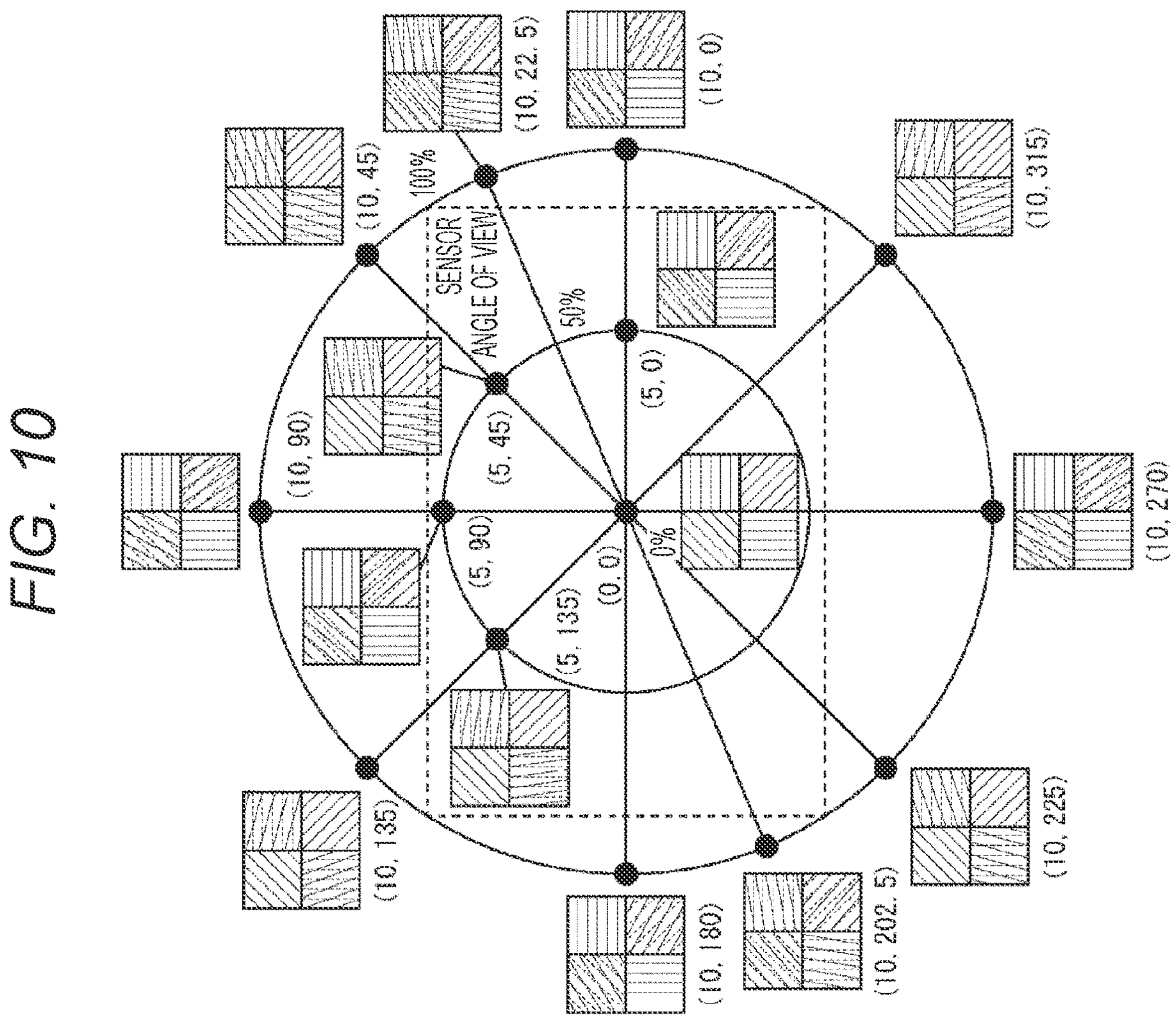
FIG. 10 is a diagram for describing a shape of a polarization member according to the first embodiment.

FIG. 10 illustrates an example of the configuration of the polarization member 126 in a case where the inclination direction and degree of the transmission axis are further adjusted. In FIG. 10, the angle of view of the pixel array unit 51 is represented by a dotted rectangle. In FIG. 10, the coordinates of the pixel array unit 51 are represented with a polar coordinate system, the coordinates of the center of the pixel array unit 51 are represented with coordinates (0, 0), the right-left direction in the drawing is represented as an X axis, and an angle formed with the X axis is represented as an orientation angle. A position in the pixel array unit 51 is represented with coordinates (r, θ) in a case where the image height is set as an image height r and the orientation angle is an orientation angle θ.

In FIG. 10, in one block, a 45° pixel is disposed in the upper left, a 0° pixel is disposed in the upper right, a 135° pixel is disposed in the lower right, and a 90° pixel is disposed in the lower left. Hereinafter, the description will be continued in this order of pixels. The wire grid is formed such that the transmission axis of the 45° pixel of the polarization member 126 disposed at coordinates (0, 0) has an angle of 45° with respect to the X axis, and hereinafter, this transmission axis is appropriately described as a 45° reference transmission axis. The description will be continued on the assumption that the angle with respect to the transmission axis is an angle when an angle on the lower left side is set as an origin and has values of 0° to 360° in the rectangle representing one pixel.

Similarly, the wire grid is formed such that the transmission axis of the 0° pixel has an angle of 0° with respect to the X axis, and hereinafter, this transmission axis is appropriately described as a 0° reference transmission axis. Similarly, the wire grid is formed such that the transmission axis of the 135° pixel has an angle of 135° with respect to the X axis, and hereinafter, this transmission axis is appropriately described as a 135° reference transmission axis. The wire grid is formed such that the transmission axis of the 90° pixel has an angle of 90° (Y axis) with respect to the X axis, and hereinafter, this transmission axis is appropriately described as a 90° reference transmission axis.

The orientation angle of the transmission axis of the 45° pixel of the polarization member 126 disposed at coordinates (5, 0) is adjusted to be an angle smaller than the orientation angle of the 45° reference transmission axis (an axis indicated by a dotted line in the drawing and an axis indicated by a dotted line in other pixels indicate the reference transmission axis). That is, the orientation angle of the transmission axis of the 45° pixel disposed at coordinates (5, 0) is an angle smaller than 45°.

The orientation angle of the transmission axis of the 0° pixel of the polarization member 126 disposed at coordinates (5, 0) is formed at an angle equivalent to the 0° reference transmission axis. In the polarization member 126 of the 0° pixel disposed at coordinates (5, 0), the polarization angle and the orientation angle of the wire grid are the same.

The orientation angle of the transmission axis of the 135° pixel of the polarization member 126 disposed at coordinates (5, 0) is adjusted to be an angle larger than the orientation angle of the 135° reference transmission axis. That is, the orientation angle of the transmission axis of the 135° pixel disposed at coordinates (5, 0) is an angle greater than 135°.

The orientation angle of the transmission axis of the 90° pixel of the polarization member 126 disposed at coordinates (5, 0) is formed at an angle equivalent to the 90° reference transmission axis. In the polarization member 126 of the 90° pixel disposed at coordinates (5, 0), the polarization angle and the orientation angle of the wire grid are the same.

The orientation angle of the transmission axis of the 45° pixel of the polarization member 126 disposed at coordinates (10, 0) is adjusted to be an angle smaller than the orientation angle of the 45° reference transmission axis. That is, the orientation angle of the transmission axis of the 45° pixel disposed at coordinates (10, 0) is an angle smaller than 45°. When compared with the orientation angle of the transmission axis of the 45° pixel of the polarization member 126 disposed at coordinates (5, 0), the angle is adjusted to be a smaller angle.

The orientation angle of the transmission axis of the 0° pixel of the polarization member 126 disposed at coordinates (10, 0) is formed at an angle equivalent to the 0° reference transmission axis. In the polarization member 126 of the 0° pixel disposed at coordinates (10, 0), the polarization angle and the orientation angle of the wire grid are the same.

The orientation angle of the transmission axis of the 135° pixel of the polarization member 126 disposed at coordinates (10, 0) is adjusted to be an angle larger than the orientation angle of the 135° reference transmission axis. That is, the orientation angle of the transmission axis of the 135° pixel disposed at coordinates (10, 0) is an angle greater than 135°. When compared with the orientation angle of the transmission axis of the 135° pixel of the polarization member 126 disposed at coordinates (5, 0), the angle is adjusted to be a larger angle.

The orientation angle of the transmission axis of the 90° pixel of the polarization member 126 disposed at coordinates (10, 0) is formed at an angle equivalent to the 90° reference transmission axis. In the polarization member 126 of the 90° pixel disposed at coordinates (10, 0), the polarization angle and the orientation angle of the wire grid are the same.

The orientation angle of the transmission axis of the 45° pixel of the polarization member 126 disposed at coordinates (10, 22.5) is adjusted to be an angle smaller than the orientation angle of the 45° reference transmission axis. That is, the orientation angle of the transmission axis of the 45° pixel disposed at coordinates (10, 22.5) is an angle smaller than 45°.

The orientation angle of the transmission axis of the 0° pixel of the polarization member 126 disposed at coordinates (10, 22.5) is adjusted to be an angle larger than the orientation angle of the 0° reference transmission axis. That is, the orientation angle of the transmission axis of the 0° pixel disposed at coordinates (10, 22.5) is an angle greater than 0°.

The orientation angle of the transmission axis of the 135° pixel of the polarization member 126 disposed at coordinates (10, 22.5) is adjusted to be an angle larger than the orientation angle of the 135° reference transmission axis. That is, the orientation angle of the transmission axis of the 135° pixel disposed at coordinates (10, 22.5) is an angle greater than 135°.

The orientation angle of the transmission axis of the 90° pixel of the polarization member 126 disposed at coordinates (10, 22.5) is adjusted to be an angle smaller than the orientation angle of the 90° reference transmission axis. That is, the orientation angle of the transmission axis of the 90° pixel disposed at coordinates (10, 22.5) is an angle smaller than 90°.

The orientation angle of the transmission axis of the 45° pixel of the polarization member 126 disposed at coordinates (5, 45) is formed at an angle equivalent to the orientation angle of the 45° reference transmission axis. In the polarization member 126 of the 45° pixel disposed at coordinates (5, 45), the polarization angle and the orientation angle of the wire grid are the same.

The orientation angle of the transmission axis of the 0° pixel of the polarization member 126 disposed at coordinates (5, 45) is adjusted to be an angle larger than the orientation angle of the 0° reference transmission axis. That is, the orientation angle of the transmission axis of the 0° pixel disposed at coordinates (5, 45) is an angle greater than 0°.

The orientation angle of the transmission axis of the 135° pixel of the polarization member 126 disposed at coordinates (5, 45) is formed at an angle equivalent to the orientation angle of the 135° reference transmission axis. In the polarization member 126 of the 135° pixel disposed at coordinates (5, 45), the polarization angle and the orientation angle of the wire grid are the same.

The orientation angle of the transmission axis of the 90° pixel of the polarization member 126 disposed at coordinates (5, 45) is adjusted to be an angle smaller than the orientation angle of the 90° reference transmission axis. That is, the orientation angle of the transmission axis of the 90° pixel disposed at coordinates (5, 45) is an angle smaller than 90°.

The orientation angle of the transmission axis of the 45° pixel of the polarization member 126 disposed at coordinates (10, 45) is set at an angle equivalent to the orientation angle of the 45° reference transmission axis. In the polarization member 126 of the 45° pixel disposed at coordinates (10, 45), the polarization angle and the orientation angle of the wire grid are the same.

The orientation angle of the transmission axis of the 0° pixel of the polarization member 126 disposed at coordinates (10, 45) is adjusted to be an angle larger than the orientation angle of the 0° reference transmission axis. That is, the orientation angle of the transmission axis of the 0° pixel disposed at coordinates (10, 45) is an angle greater than 0°. When compared with the orientation angle of the transmission axis of the 45° pixel of the polarization member 126 disposed at coordinates (5, 45), the angle is adjusted to be a larger angle.

The orientation angle of the transmission axis of the 135° pixel of the polarization member 126 disposed at coordinates (10, 45) is formed at an angle equivalent to the orientation angle of the 135° reference transmission axis. In the polarization member 126 of the 135° pixel disposed at coordinates (10, 45), the polarization angle and the orientation angle of the wire grid are the same.

The orientation angle of the transmission axis of the 90° pixel of the polarization member 126 disposed at coordinates (10, 45) is adjusted to be an angle smaller than the orientation angle of the 90° reference transmission axis. That is, the orientation angle of the transmission axis of the 90° pixel disposed at coordinates (10, 45) is an angle smaller than 90°. When compared with the orientation angle of the transmission axis of the 90° pixel of the polarization member 126 disposed at coordinates (5, 0), the angle is adjusted to be a smaller angle.

The orientation angle of the transmission axis of the 45° pixel of the polarization member 126 disposed at coordinates (5, 90) is adjusted to be an angle larger than the orientation angle of the 45° reference transmission axis. That is, the orientation angle of the transmission axis of the 45° pixel disposed at coordinates (5, 90) is an angle greater than 45°.

The orientation angle of the transmission axis of the 0° pixel of the polarization member 126 disposed at coordinates (5, 90) is formed at an angle equivalent to the orientation angle of the 0° reference transmission axis. In the polarization member 126 of the 0° pixel disposed at coordinates (5, 90), the polarization angle and the orientation angle of the wire grid are the same.

The orientation angle of the transmission axis of the 135° pixel of the polarization member 126 disposed at coordinates (5, 90) is adjusted to be an angle smaller than the orientation angle of the 135° reference transmission axis. That is, the orientation angle of the transmission axis of the 135° pixel disposed at coordinates (5, 90) is an angle smaller than 135°.

The orientation angle of the transmission axis of the 90° pixel of the polarization member 126 disposed at coordinates (5, 90) is formed at an angle equivalent to the orientation angle of the 90° reference transmission axis. In the polarization member 126 of the 90° pixel disposed at coordinates (5, 90), the polarization angle and the orientation angle of the wire grid are the same.

The orientation angle of the transmission axis of the 45° pixel of the polarization member 126 disposed at coordinates (10, 90) is adjusted to be an angle larger than the orientation angle of the 45° reference transmission axis. That is, the orientation angle of the transmission axis of the 45° pixel disposed at coordinates (10, 90) is an angle greater than 45°. When compared with the orientation angle of the transmission axis of the 45° pixel of the polarization member 126 disposed at coordinates (5, 90), the angle is adjusted to be a larger angle.

The orientation angle of the transmission axis of the 0° pixel of the polarization member 126 disposed at coordinates (10, 90) is formed at an angle equivalent to the orientation angle of the 0° reference transmission axis. In the polarization member 126 of the 0° pixel disposed at coordinates (10, 90), the polarization angle and the orientation angle of the wire grid are the same.

The orientation angle of the transmission axis of the 135° pixel of the polarization member 126 disposed at coordinates (10, 90) is adjusted to be an angle smaller than the orientation angle of the 135° reference transmission axis. That is, the orientation angle of the transmission axis of the 135° pixel disposed at coordinates (10, 90) is an angle smaller than 135°. When compared with the orientation angle of the transmission axis of the 135° pixel of the polarization member 126 disposed at coordinates (5, 0), the angle is adjusted to be a smaller angle.

The orientation angle of the transmission axis of the 90° pixel of the polarization member 126 disposed at coordinates (10, 90) is formed at an angle equivalent to the orientation angle of the 90° reference transmission axis. In the polarization member 126 of the 90° pixel disposed at coordinates (10, 90), the polarization angle and the orientation angle of the wire grid are the same.

The orientation angle of the transmission axis of the 45° pixel of the polarization member 126 disposed at coordinates (5, 135) is formed at an angle equivalent to the orientation angle of the 45° reference transmission axis. In the polarization member 126 of the 45° pixel disposed at coordinates (5, 135), the polarization angle and the orientation angle of the wire grid are the same.

The orientation angle of the transmission axis of the 0° pixel of the polarization member 126 disposed at coordinates (5, 135) is adjusted to be an angle larger than the orientation angle of the 0° reference transmission axis. That is, the orientation angle of the transmission axis of the 0° pixel disposed at coordinates (5, 135) is an angle greater than 0°, and an angle greater than 270° (angle close to 360°). Note that in a case where an angle of 0° or less is expressed to negative, the orientation angle of the transmission axis of the 0° pixel of the polarization member 126 disposed at coordinates (5, 135) is an angle smaller than the orientation angle of the 0° reference transmission axis, and for example, is adjusted to be an angle ranging from −10° to 0°.

The orientation angle of the transmission axis of the 135° pixel of the polarization member 126 disposed at coordinates (5, 135) is formed at an angle equivalent to the orientation angle of the 135° reference transmission axis. In the polarization member 126 of the 135° pixel disposed at coordinates (5, 135), the polarization angle and the orientation angle of the wire grid are the same.

The orientation angle of the transmission axis of the 90° pixel of the polarization member 126 disposed at coordinates (5, 135) is adjusted to be an angle larger than the orientation angle of the 90° reference transmission axis. That is, the orientation angle of the transmission axis of the 90° pixel disposed at coordinates (5, 135) is an angle greater than 90°.

The orientation angle of the transmission axis of the 45° pixel of the polarization member 126 disposed at coordinates (10, 135) is set at an angle equivalent to the orientation angle of the 45° reference transmission axis. In the polarization member 126 of the 45° pixel disposed at coordinates (10, 135), the polarization angle and the orientation angle of the wire grid are the same.

The orientation angle of the transmission axis of the 0° pixel of the polarization member 126 disposed at coordinates (10, 135) is adjusted to be an angle larger than the orientation angle of the 0° reference transmission axis. That is, the orientation angle of the transmission axis of the 0° pixel disposed at coordinates (10, 135) is an angle greater than 0°, and an angle greater than 270° (angle close to 360°). When compared with the orientation angle of the transmission axis of the 45° pixel of the polarization member 126 disposed at coordinates (5, 135), the angle is adjusted to be a smaller angle. Note that in a case where an angle of 0° or less is expressed to negative, the orientation angle of the transmission axis of the 0° pixel of the polarization member 126 disposed at coordinates (10, 135) is an angle smaller than the orientation angle of the 0° reference transmission axis, and for example, is adjusted to be an angle ranging from −10° to 0°.

The orientation angle of the transmission axis of the 135° pixel of the polarization member 126 disposed at coordinates (10, 135) is formed at an angle equivalent to the orientation angle of the 135° reference transmission axis. In the polarization member 126 of the 135° pixel disposed at coordinates (10, 135), the polarization angle and the orientation angle of the wire grid are the same.

The orientation angle of the transmission axis of the 90° pixel of the polarization member 126 disposed at coordinates (10, 135) is adjusted to be an angle larger than the orientation angle of the 90° reference transmission axis. That is, the orientation angle of the transmission axis of the 90° pixel disposed at coordinates (10, 135) is an angle greater than 90°. When compared with the orientation angle of the transmission axis of the 90° pixel of the polarization member 126 disposed at coordinates (5, 0), the angle is adjusted to be a larger angle.

The orientation angle of the transmission axis of the 45° pixel of the polarization member 126 disposed at coordinates (10, 180) is adjusted to be an angle smaller than the orientation angle of the 45° reference transmission axis. That is, the orientation angle of the transmission axis of the 45° pixel disposed at coordinates (10, 180) is an angle smaller than 45°.

The orientation angle of the transmission axis of the 0° pixel of the polarization member 126 disposed at coordinates (10, 180) is formed at an angle equivalent to the orientation angle of the 0° reference transmission axis. In the polarization member 126 of the 0° pixel disposed at coordinates (10, 180), the polarization angle and the orientation angle of the wire grid are the same.

The orientation angle of the transmission axis of the 135° pixel of the polarization member 126 disposed at coordinates (10, 180) is adjusted to be an angle larger than the orientation angle of the 135° reference transmission axis. That is, the orientation angle of the transmission axis of the 135° pixel disposed at coordinates (10, 180) is an angle greater than 135°.

The orientation angle of the transmission axis of the 90° pixel of the polarization member 126 disposed at coordinates (10, 180) is formed at an angle equivalent to the orientation angle of the 90° reference transmission axis. In the polarization member 126 of the 90° pixel disposed at coordinates (10, 180), the polarization angle and the orientation angle of the wire grid are the same.

The orientation angle of the transmission axis of the 45° pixel of the polarization member 126 disposed at coordinates (10, 202.5) is adjusted to be an angle smaller than the orientation angle of the 45° reference transmission axis. That is, the orientation angle of the transmission axis of the 45° pixel disposed at coordinates (10, 202.5) is an angle smaller than 45°.

The orientation angle of the transmission axis of the 0° pixel of the polarization member 126 disposed at coordinates (10, 202.5) is adjusted to be an angle larger than the orientation angle of the 0° reference transmission axis. That is, the orientation angle of the transmission axis of the 0° pixel disposed at coordinates (10, 202.5) is an angle greater than 0°.

The orientation angle of the transmission axis of the 135° pixel of the polarization member 126 disposed at coordinates (10, 202.5) is adjusted to be an angle larger than the orientation angle of the 135° reference transmission axis. That is, the orientation angle of the transmission axis of the 135° pixel disposed at coordinates (10, 202.5) is an angle greater than 135°.

The orientation angle of the transmission axis of the 90° pixel of the polarization member 126 disposed at coordinates (10, 202.5) is adjusted to be an angle smaller than the orientation angle of the 90° reference transmission axis. That is, the orientation angle of the transmission axis of the 90° pixel disposed at coordinates (10, 202.5) is an angle smaller than 90°.

The orientation angle of the transmission axis of the 45° pixel of the polarization member 126 disposed at coordinates (10, 225) is set at an angle equivalent to the orientation angle of the 45° reference transmission axis. In the polarization member 126 of the 45° pixel disposed at coordinates (10, 225), the polarization angle and the orientation angle of the wire grid are the same.

The orientation angle of the transmission axis of the 0° pixel of the polarization member 126 disposed at coordinates (10, 225) is adjusted to be an angle larger than the orientation angle of the 0° reference transmission axis. That is, the orientation angle of the transmission axis of the 0° pixel disposed at coordinates (10, 225) is an angle greater than 0°.

The orientation angle of the transmission axis of the 135° pixel of the polarization member 126 disposed at coordinates (10, 225) is formed at an angle equivalent to the orientation angle of the 135° reference transmission axis. In the polarization member 126 of the 135° pixel disposed at coordinates (10, 225), the polarization angle and the orientation angle of the wire grid are the same.

The orientation angle of the transmission axis of the 90° pixel of the polarization member 126 disposed at coordinates (10, 225) is adjusted to be an angle smaller than the orientation angle of the 90° reference transmission axis. That is, the orientation angle of the transmission axis of the 90° pixel disposed at coordinates (10, 225) is an angle smaller than 90°.

The orientation angle of the transmission axis of the 45° pixel of the polarization member 126 disposed at coordinates (10, 270) is adjusted to be an angle larger than the orientation angle of the 45° reference transmission axis. That is, the orientation angle of the transmission axis of the 45° pixel disposed at coordinates (10, 270) is an angle greater than 450°.

The orientation angle of the transmission axis of the 0° pixel of the polarization member 126 disposed at coordinates (10, 270) is formed at an angle equivalent to the orientation angle of the 0° reference transmission axis. In the polarization member 126 of the 0° pixel disposed at coordinates (10, 270), the polarization angle and the orientation angle of the wire grid are the same.

The orientation angle of the transmission axis of the 135° pixel of the polarization member 126 disposed at coordinates (10, 270) is adjusted to be an angle smaller than the orientation angle of the 135° reference transmission axis. That is, the orientation angle of the transmission axis of the 135° pixel disposed at coordinates (10, 270) is an angle smaller than 135°.

The orientation angle of the transmission axis of the 90° pixel of the polarization member 126 disposed at coordinates (10, 270) is formed at an angle equivalent to the orientation angle of the 90° reference transmission axis. In the polarization member 126 of the 90° pixel disposed at coordinates (10, 270), the polarization angle and the orientation angle of the wire grid are the same.

The orientation angle of the transmission axis of the 45° pixel of the polarization member 126 disposed at coordinates (10, 315) is set at an angle equivalent to the orientation angle of the 45° reference transmission axis. In the polarization member 126 of the 45° pixel disposed at coordinates (10, 315), the polarization angle and the orientation angle of the wire grid are the same.

The orientation angle of the transmission axis of the 0° pixel of the polarization member 126 disposed at coordinates (5, 315) is adjusted to be an angle larger than the orientation angle of the 0° reference transmission axis. That is, the orientation angle of the transmission axis of the 0° pixel disposed at coordinates (5, 315) is an angle greater than 0°, and an angle greater than 270° (angle close to 360°).

The orientation angle of the transmission axis of the 135° pixel of the polarization member 126 disposed at coordinates (10, 315) is formed at an angle equivalent to the orientation angle of the 135° reference transmission axis. In the polarization member 126 of the 135° pixel disposed at coordinates (10, 315), the polarization angle and the orientation angle of the wire grid are the same.

The orientation angle of the transmission axis of the 90° pixel of the polarization member 126 disposed at coordinates (10, 315) is adjusted to be an angle larger than the orientation angle of the 90° reference transmission axis. That is, the orientation angle of the transmission axis of the 90° pixel disposed at coordinates (10, 315) is an angle greater than 90°.

In this manner, the orientation angle of the transmission axis is adjusted according to the position of the pixel array unit 51. In a case where the image height is high, it is assumed that a chief ray angle (CRA) of the lens increases, and the correction amount of the angle of the transmission axis is also adjusted to increase.

Note that, depending on the design of the lens 16, there are a lens designed such that the CRA does not increase even when the image height increases, and a lens designed such that the CRA decreases when the image height increases. Here, a case where the correction amount of the angle of the transmission axis is adjusted to increase on the assumption that the CRA also increases as the image height increases has been described as an example, but the correction amount may be set to decrease in a case where the image height is high depending on the design of the lens 16. The correction amount of the angle of the transmission axis is set depending on the incident angle of the light incident on the photoelectric conversion element 123.

In the pixels 50 located in a 0° direction (180° direction) and a 90° direction (270° direction) in the position of the pixel array unit 51, the 45° pixel and the 135° pixel are corrected. In the pixels 50 located in a 45° direction (225° direction) and a 135° direction (315° direction) in the position of the pixel array unit 51, the 0° pixel and the 90° pixel are corrected.

In four pixels included in one block, the orientation angle of the polarization member 126 of a pixel at a position where the orientation from the center of the pixel array unit 51 and the polarization angle of the polarization member 126 are in a relationship of 0° or 90° is the same as the polarization angle, and the orientation angle of the polarization member 126 of a pixel at a position which is not in the relationship of 0° or 90° is an angle corrected with a correction amount corresponding to the image height.

The pixels at a position where the orientation from the center of the pixel array unit 51 and the polarization angle of the polarization member 126 are in a relationship of 0° or 90° are, for example, a 45° pixel and a 135° pixel, which are at coordinates (5, 45), and in the 45° pixel and the 135° pixel, the orientation angle described above is the same as the polarization angle. On the other hand, the pixels at a position where the orientation from the center of the pixel array unit 51 and the polarization angle of the polarization member 126 are not in the relationship of 0° or 90° are, for example, a 0° pixel and a 90° pixel, which are at coordinates (5, 45), and in the 0° pixel and the 90° pixel, the orientation angle described above is an angle obtained by correcting the polarization angle with the correction amount corresponding to the image height.

The correction amount increases as a distance from the center of the pixel array unit 51 increases. In other words, the deviation from the orientation angle of the polarization member 126 located at the center of the pixel array unit 51 increases as the distance from the center of the pixel array unit 51 increases.

In a case where the orientation angle of the transmission axis of the polarization member 126 is adjusted in this manner, and in a case where the correction amount for how much to deviate from the reference angle is set, it is possible to reduce the influence on the Fresnel reflection of the lens 16 by setting the correction amount in consideration of the influence of the Fresnel reflection of the lens 16 (FIG. 1).

Figure 11:
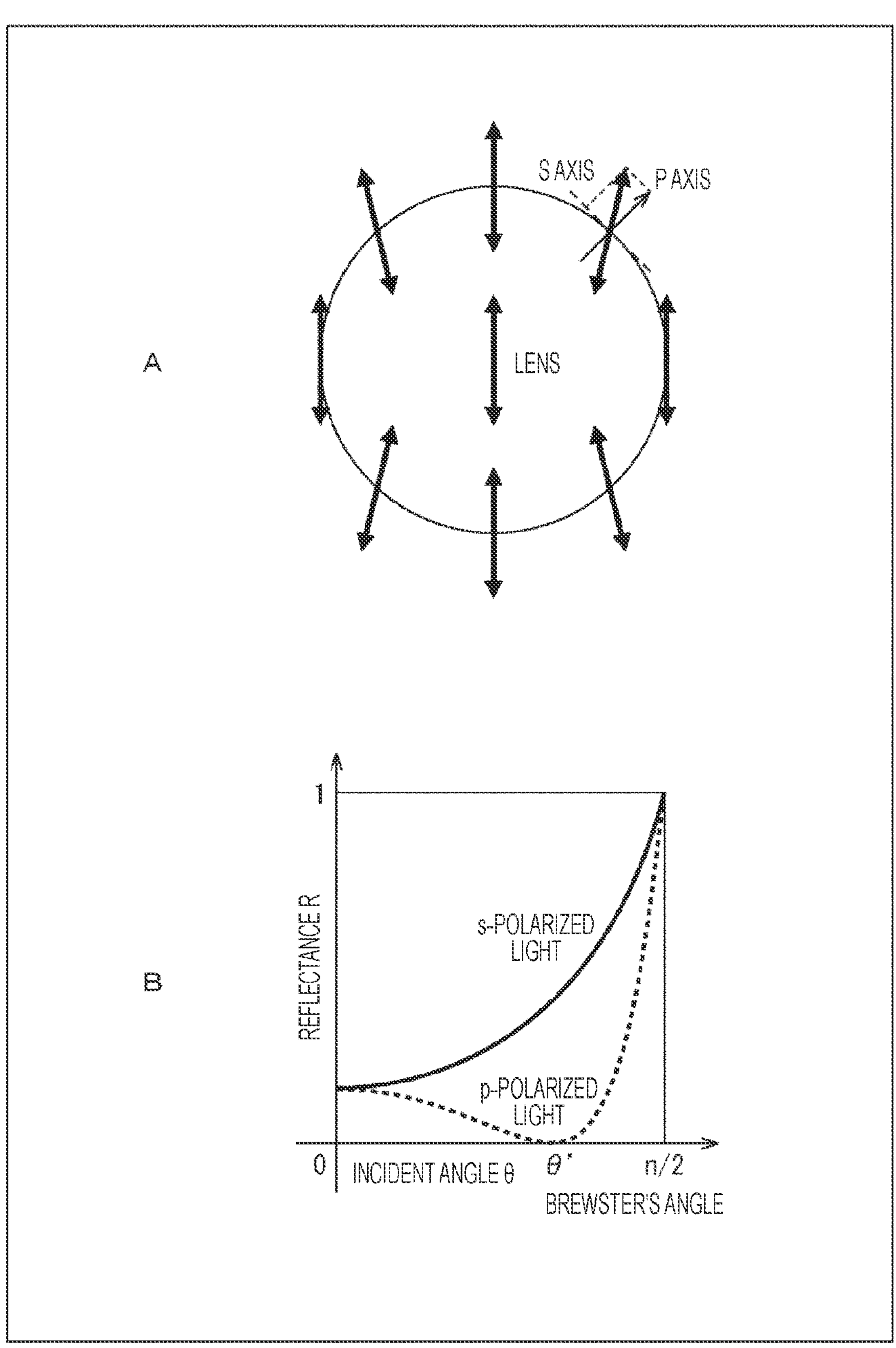
FIG. 11 is a diagram for describing an effect caused by Fresnel reflection.

When light is obliquely incident on the lens 16 or the polarization member 126, the Fresnel reflection occurs, and as illustrated in B of FIG. 11, the reflectance of a S wave and the reflectance of a P wave are different due to the incident angle. Therefore, as illustrated in A of FIG. 11, there is a possibility that a phenomenon occurs in which the orientation of linearly polarized light turns due to the combination of a position where light is transmitted to the lens 16 and the polarization direction (light rotation). Originally, when light orthogonal to the linearly polarized light is rotated by the lens 16, there is a possibility that a state orthogonal to the polarization member 126 (crossed-Nicols state) collapses, a part of the light is transmitted, and the extinction ratio decreases.

By setting the correction amount described above in consideration of the influence of Fresnel reflection, the influence of Fresnel reflection on the lens surface can also be reduced. Specifically, when setting the correction amount, it is possible to reduce the influence of the Fresnel reflection on the lens surface by setting the correction amount in consideration of design information of the lens 16, for example, information regarding the incident angle of light, and information such as a curvature and refractive index of the lens surface.

<Regarding Manufacturing of Corrected Polarization Member>

Manufacturing of the imaging element 11 including the polarization member 126 in which the angle of the orientation angle of the transmission axis is adjusted according to the image height as described with reference to FIG. 10 will be described.

In step S11, a photoelectric conversion element 123 is formed in a semiconductor substrate 102. An insulation film 124 is formed on the semiconductor substrate 102 on which the photoelectric conversion element 123 is formed. Moreover, a film to be the polarization member 126 is formed on the insulation film 124. An inorganic hard mask 201 is formed on the film to be the polarization member 126, and a resist mask 202 is further formed.

In step S12, exposure and development are performed, and thus the resist mask 202 is, for example, formed on a mask on which the polarization member 126 illustrated in FIG. 10 is formed. A resist pattern mask used in step S12 is a resist mask pattern in which the orientation angle of the transmission axis is adjusted according to the image height.

In step S13, a pattern is transferred to the inorganic hard mask 201 by dry etching. In step S14, the polarization member 126 is processed by dry etching with the inorganic hard mask 201 as a pattern. In a case where the pattern of the polarization member 126 is fine and it is difficult to directly process the polarization member 126, the inorganic hard mask 201 is processed once, and then the polarization member 126 is processed.

After that, by removing the inorganic hard mask 201, for example, the imaging element 11 is formed in which the polarization member 126 of which the angle of the orientation angle of the transmission axis is adjusted according to the image height as illustrated in FIG. 10 is formed.

Second Embodiment

Figure 13:
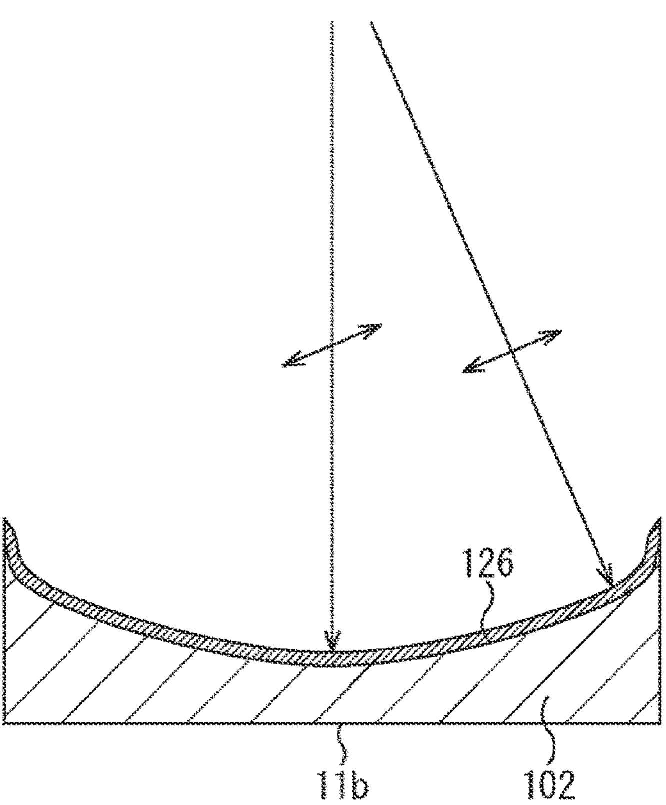
FIG. 13 is a diagram illustrating a configuration example of an imaging element according to a second embodiment.

FIG. 13 is a diagram illustrating a cross-sectional configuration example of an imaging element 11*b* according to the second embodiment.

Like the imaging element 11 according to the first embodiment (hereinafter, the imaging element 11 according to the first embodiment will be appropriately described as an imaging element 11*a*), the imaging element 11*b* according to the second embodiment also can reduce non-uniformity of the extinction ratio in the plane.

In the imaging element 11*b* illustrated in FIG. 13, the light incident surface side of the semiconductor substrate 102 on which the photoelectric conversion element 123 is formed is formed in a curved shape. Furthermore, on the semiconductor substrate 102 formed in the curved shape, the polarization member 126 is formed in accordance with the curved shape. Therefore, the polarization member 126 is also formed in the curved shape.

On an end side of the pixel array unit 51, even in a case where light is incident in an oblique direction, the incident surface is formed with an angle such that the light in the oblique direction is vertically incident. By forming the polarization member 126 in the curved shape, light can be vertically incident on the polarization member 126 even in a case where the light is incident in an oblique direction, a portion where the extinction ratio decreases in the pixel array unit 51 can be reduced, and the extinction ratio can be prevented from being non-uniform.

The curved shape of the polarization member 126 can be formed by matching the curvature with the CRA of the lens 16 (FIG. 1). The deviation of the Fresnel reflection can also be corrected by adjusting the curvature of the curved shape of the polarization member 126 by using the design value of the lens 16, for example, the information regarding the incident angle of light and the information regarding the curvature and refractive index of the lens surface.

In a case where the polarization member 126 is formed in the curved shape, the polarization member 126 having the same polarization angle may be disposed regardless of the position of the pixel array unit 51 as described with reference to FIG. 5 (regardless of the image height). Alternatively, as described with reference to FIG. 10, the polarization member 126 of which the orientation angle is adjusted by using the image height may be disposed. In this case, the adjustment of the orientation angle can be finely performed, and the correction amount can be reduced.

<Regarding Manufacturing of Imaging Element According to Second Embodiment>

Figure 14:
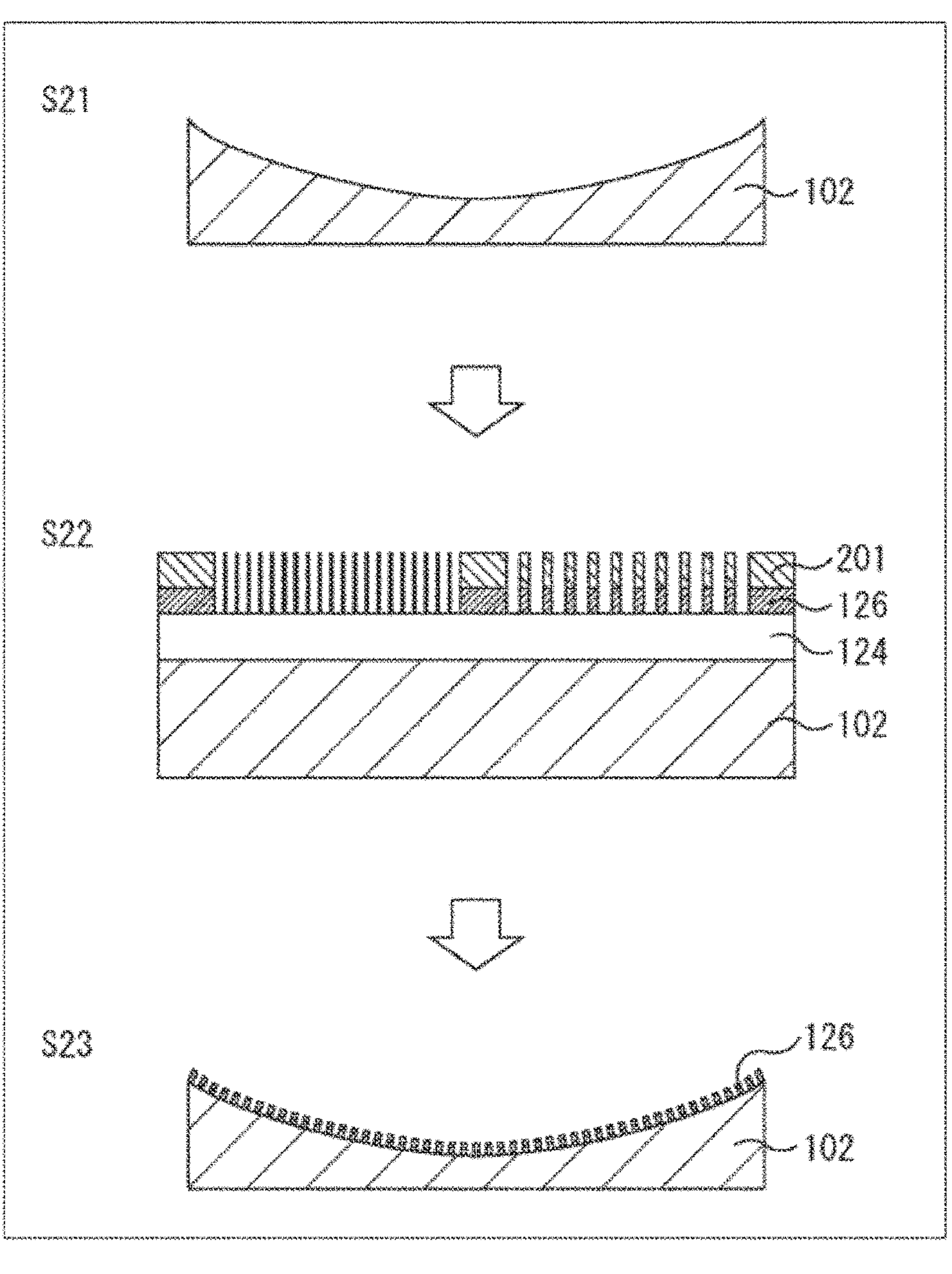
FIG. 14 is a diagram for describing manufacturing of an imaging element according to the second embodiment.

The manufacturing of the imaging element 11*b* according to the second embodiment will be described with reference to FIG. 14.

Figure 12:
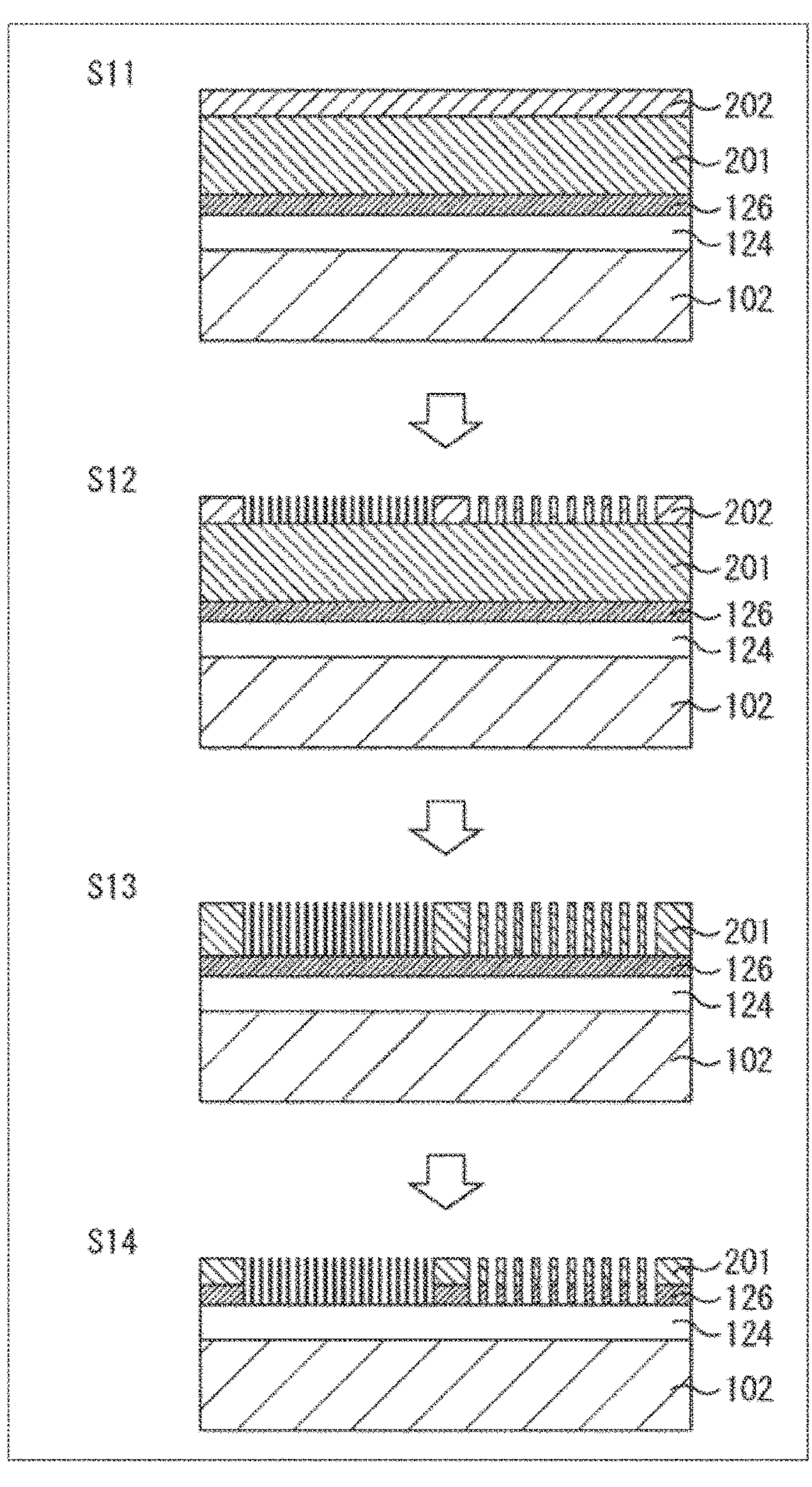
FIG. 12 is a diagram for describing manufacturing of an imaging element according to the first embodiment.

In step S21, a semiconductor substrate 102 in which the light incident surface side is formed in a curved shape is formed by using a method of performing isotropic dry etching on a separately prepared semiconductor substrate 102. As described with reference to FIG. 12, in steps S11 to S14, the semiconductor substrate 102, on which the photoelectric conversion element 123 is formed and the polarization member 126 is formed, is prepared. Steps S11 to S14 may be performed at a wafer level such that the semiconductor substrate 102 is divided into pieces to be prepared, and steps S11 to S14 may also be performed on the divided semiconductor substrates 102 such that the divided semiconductor substrates 102 are prepared.

The view illustrated in step S22 is an enlarged view of a part of the semiconductor substrate 102 formed in step S14, and is a view illustrating the polarization member 126 formed on the semiconductor substrate 102. In step S22, the substrate is thinned.

As the resist pattern mask used in a case where the imaging element 11*b* according to the second embodiment is manufactured, a pattern in which the transmission axis is not corrected, in other words, a pattern formed at the same orientation angle regardless of the image height is used.

In step S23, the semiconductor substrate 102 thinned in step S22 is bonded to a support substrate formed in the curved shape in step S21. In this manner, the imaging element 11*b* in which the polarization member 126 is also formed in the curved shape is formed.

Third Embodiment

Figure 15:
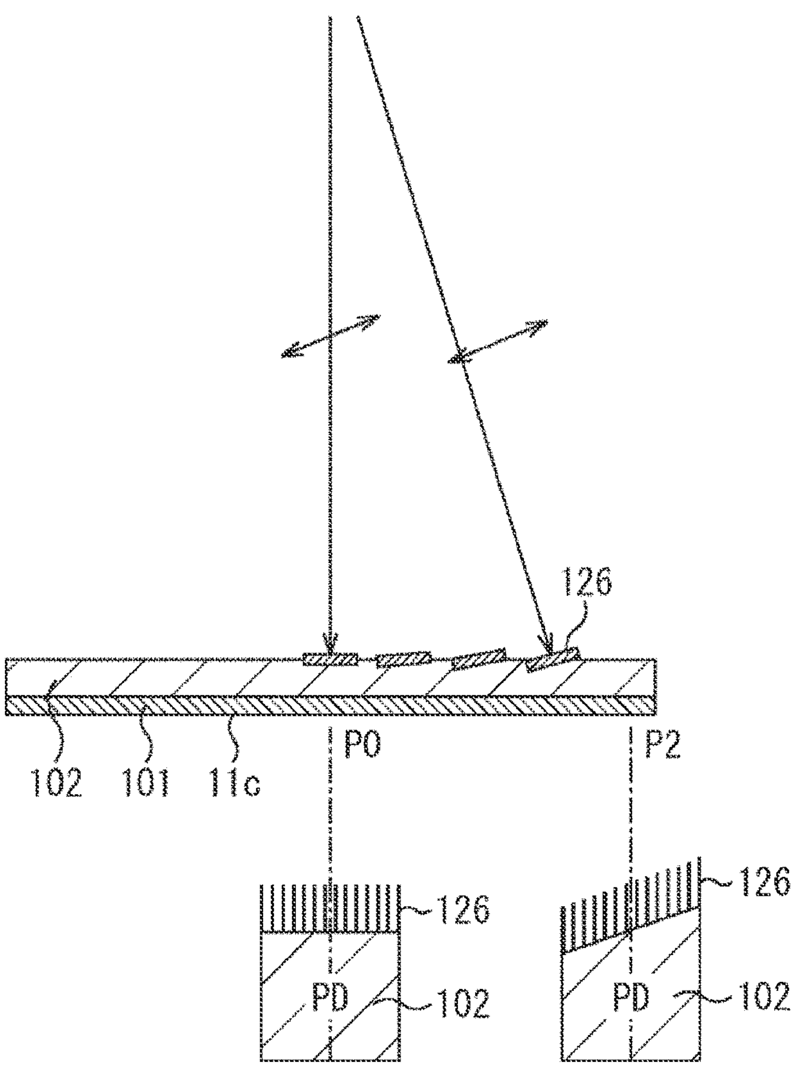
FIG. 15 is a diagram illustrating a configuration example of an imaging element according to a third embodiment.

FIG. 15 is a diagram illustrating a cross-sectional configuration example of an imaging element 11*c* according to the third embodiment. The imaging element 11*c* according to the third embodiment is configured such that an angle is provided on the light receiving surface for each pixel 50 and light is incident perpendicularly to the incident light in an oblique direction.

The pixel 50 located at the central portion P0 of the pixel array unit 51 is formed in parallel with the XY plane of the pixel array unit 51, in other words, in a state having no angle. The pixel 50 located at the right-end central portion P2 of the pixel array unit 51 is formed in a state of having a predetermined angle with respect to the XY plane of the pixel array unit 51, and is formed such that the light receiving surface faces the central portion P0 side of the pixel array unit 51.

Although not illustrated, for example, the pixel 50 located in the upper right portion P1 of the pixel array unit 51 is also formed such that the light receiving surface faces the central portion P0 side of the pixel array unit 51. Since the light receiving surface is formed to have an angle, the polarization member 126 is also formed to have an angle.

In a case where correction referred to as pupil correction is applied to, for example, the on-chip microlens 128, the photoelectric conversion element 123, or the like, an angle corresponding to the pupil correction is set. The angle can be set in consideration of, for example, an angle for reducing the influence of Fresnel reflection estimated from the design value of the lens 16 (FIG. 1).

As described above, the light receiving surface (polarization member 126) of the pixel 50 is formed to have an angle so as to face the center side of the pixel array unit 51 according to the position of the pixel array unit 51, in other words, according to the image height. The angle increases as the image height increases.

Since the light receiving surface is formed to have an angle, even light incident in an oblique direction can be incident substantially perpendicularly to the light receiving surface. That is, even the light incident in the oblique direction can be incident substantially perpendicularly to the polarization member 126. Therefore, it is possible to prevent the extinction ratio from decreasing also in the peripheral portion of the pixel array unit 51.

In a case where the polarization member 126 is provided to have an angle for each pixel 50, the polarization member 126 having the same polarization angle may be disposed regardless of the position of the pixel array unit 51 as described with reference to FIG. 5 (regardless of the image height). Alternatively, as described with reference to FIG. 10, the polarization member 126 of which the orientation angle is adjusted by using the image height may be disposed. In this case, the adjustment of the orientation angle can be finely performed, and the correction amount can be reduced.

Fourth Embodiment

Figure 16:
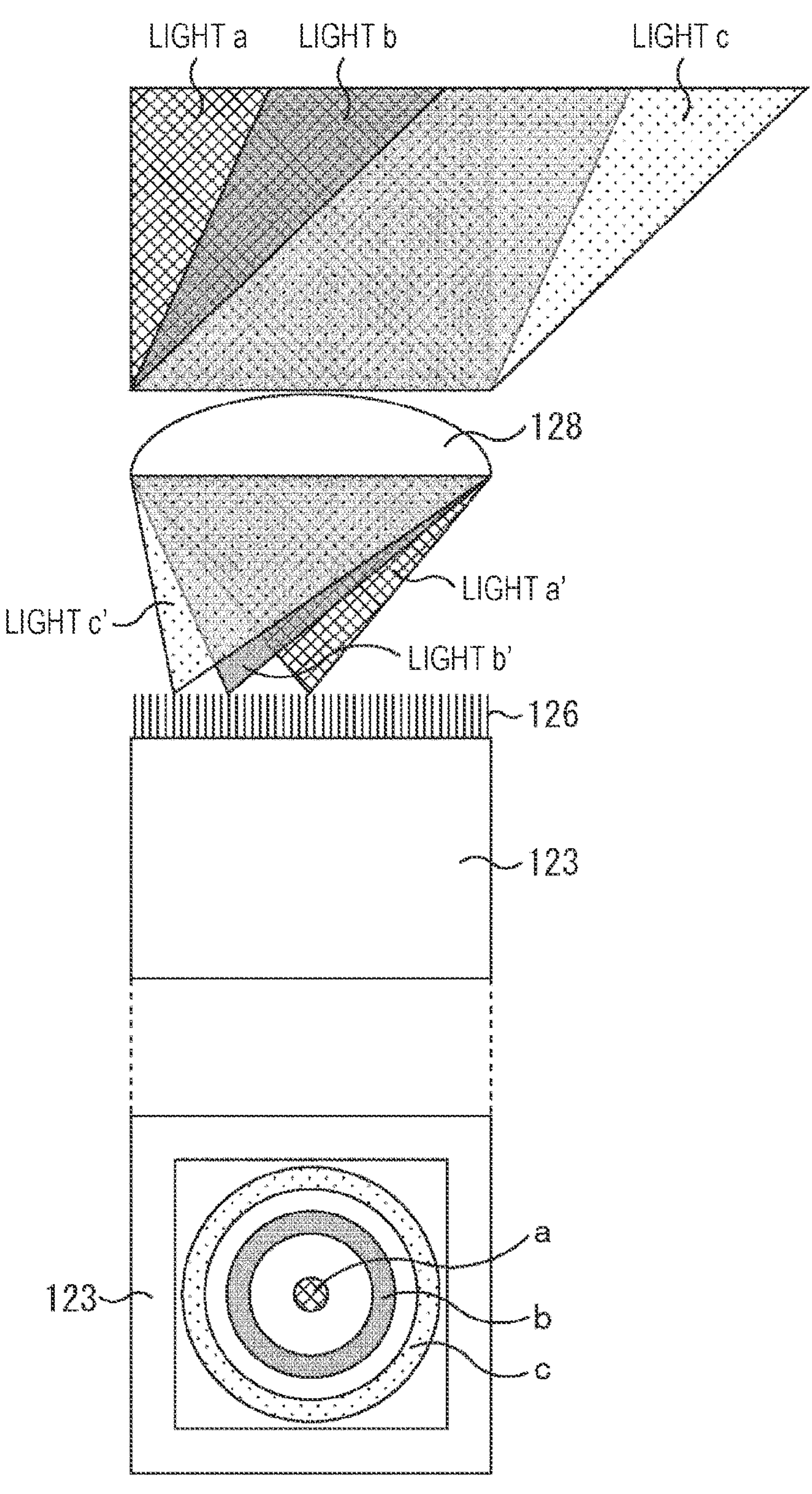
FIG. 16 is a diagram for describing F-number dependency of an extinction ratio.

FIG. 16 is a diagram for describing the extinction ratio dependent on F-number. FIG. 16 schematically illustrates the photoelectric conversion element 123 of one pixel 50 and light incident on the photoelectric conversion element 123.

Light a represents light vertically incident on the pixel 50. The light a incident on the on-chip microlens 128 is incident on the photoelectric conversion element 123 as light a' condensed on the central portion of the photoelectric conversion element 123. The light vertically incident on the photoelectric conversion element 123, such as the light a, is incident on a central portion a of the photoelectric conversion element 123 (lower side in FIG. 16). The central portion a is appropriately described as a spot a.

Light b represents light incident on the pixel 50 in an oblique direction. The light b incident on the on-chip microlens 128 is incident on the photoelectric conversion element 123 as light b' condensed on a portion around the central portion and end portion of the photoelectric conversion element 123. The light incident on the photoelectric conversion element 123 in the oblique direction, such as the light b, is incident on a spot b deviated from the central portion a of the photoelectric conversion element 123 (lower side in FIG. 16).

Light c is light incident on the pixel 50 in an oblique direction, and represents light incident in a direction more oblique than the light b. The light c incident on the on-chip microlens 128 is incident on the photoelectric conversion element 123 as light c' condensed on a portion around the end portion of the photoelectric conversion element 123. The light incident on the photoelectric conversion element 123 in the oblique direction, such as the light c, is incident on a spot c at the end portion of the photoelectric conversion element 123 (lower side in FIG. 16).

It can be seen that the light a is condensed on the spot a of the photoelectric conversion element 123, the light b is condensed on the spot b of the photoelectric conversion element 123, and the light c is condensed on the spot c of the photoelectric conversion element 123. That is, it can be seen that the light tends to be condensed on the end portion side of the photoelectric conversion element 123 as the incident angle of the light decreases.

In other words, the light in the oblique direction is incident on the periphery of the pixel 50 with respect to the center of the pixel 50. This indicates that the diameter of the spot increases as the F-number decreases. When the F-number decreases, there is a possibility that the extinction ratio decreases.

Figure 17:
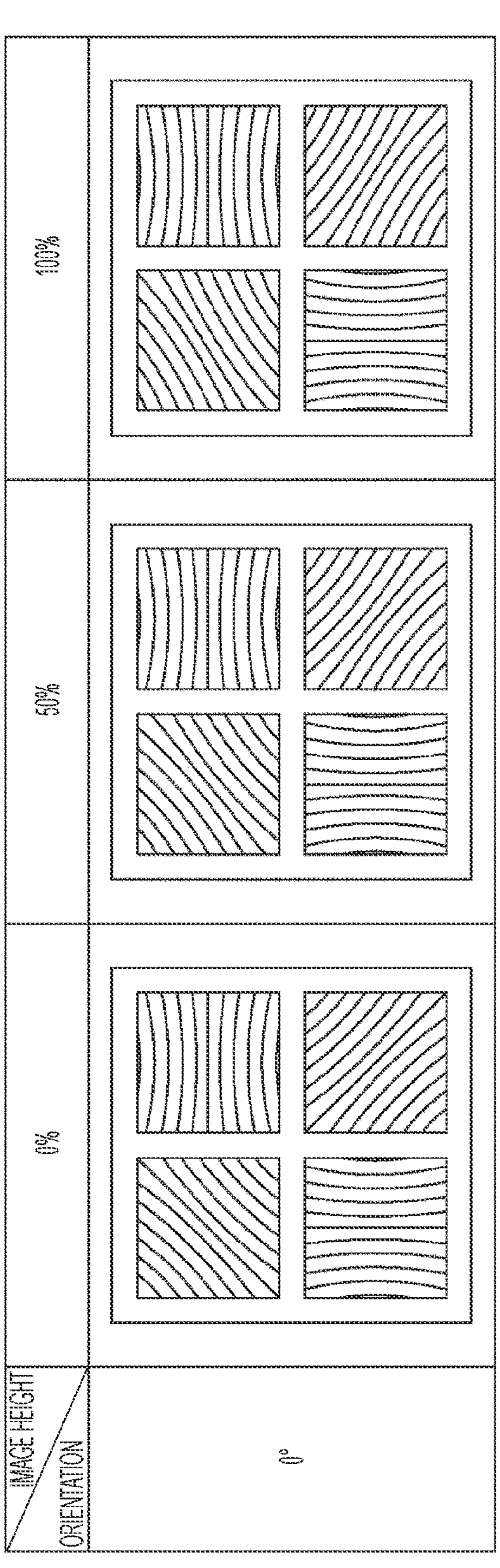
FIG. 17 is a diagram for describing a shape of a polarization member according to a fourth embodiment.
Figure 18:
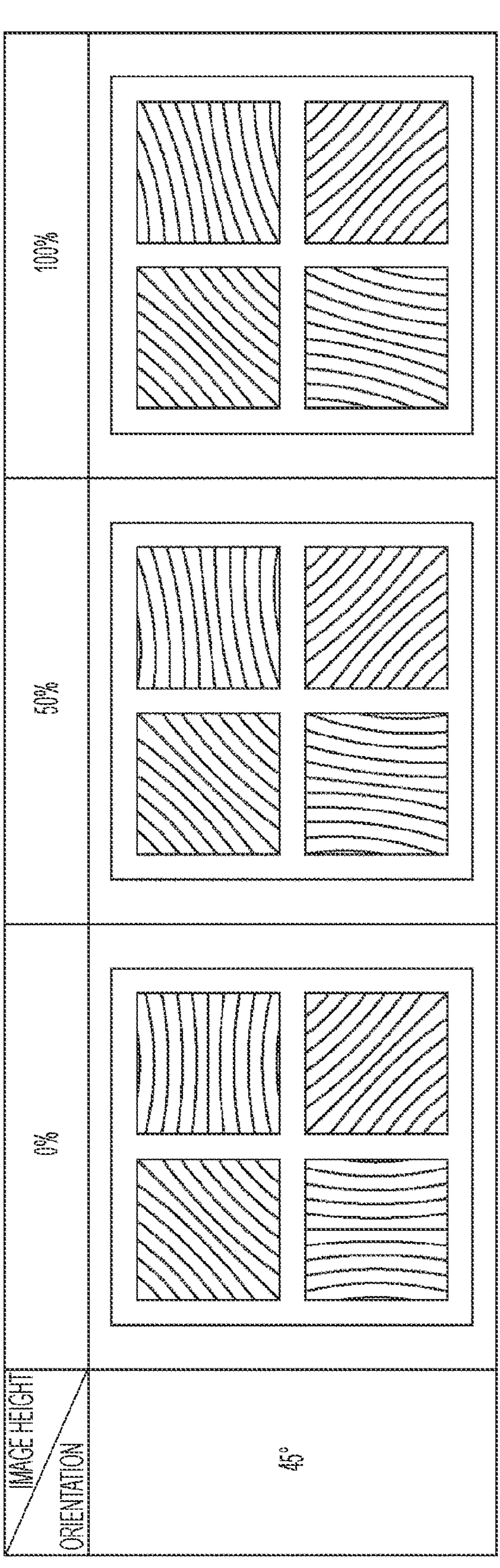
FIG. 18 is a diagram for describing a shape of a polarization member according to the fourth embodiment.

Therefore, as illustrated in FIG. 17 and FIG. 18, the shape of the wire grid of the polarization member 126 in the pixel 50 is a curved shape. The imaging element 11 including the polarization member 126 having the curved shape to be described below will be described as an imaging element 11*d*.

FIG. 17 illustrates the shapes of the polarization members 126 of one block at a position where the orientation is 0° and the image heights are 0%, 50%, and 100%, respectively. The orientation and the image height are similar to those in FIG. 10, and the orientation of 0° and the image height of 0% indicates coordinates (0, 0) and the center of the pixel array unit 51. Among the pixels 50 of one block illustrated in FIG. 17, the upper left pixel 50 is a 45° pixel, the upper right pixel 50 is a 0° pixel, the lower right pixel 50 is a 135° pixel, and the lower left pixel 50 is a 90° pixel.

In the shape (shape of the transmission axis) of the wire grid of each of the 45° pixel, the 0° pixel, the 135° pixel, and the 90° pixel at coordinates (0, 0), a line passing through the center of the pixel 50 is formed in a linear shape, but other lines are formed in a shape curved in an in-plane direction of the pixel 50 (shape curved in a center direction of the pixel). Referring to the 45° pixel, the wire grid located on the upper left side in the drawing and the wire grid located on the lower right side in the drawing are each formed in a curved shape as compared with the wire grid located at the center of the 45° pixel.

Referring to the 0° pixel, the wire grid located on the upper side in the drawing and the wire grid located on the lower side in the drawing are each formed in a curved shape as compared with the wire grid located at the center of the 0° pixel.

Similarly, referring to the 135° pixel, the wire grid located on the upper right side in the drawing and the wire grid located on the lower left side in the drawing are each formed in a curved shape as compared with the wire grid located at the center of the 135° pixel.

Similarly, referring to the 90° pixel, the wire grid located on the left side in the drawing and the wire grid located on the right side in the drawing are each formed in a curved shape as compared with the wire grid located at the center of the 90° pixel.

The polarization member 126 of the pixel 50 disposed in the pixel array unit 51 may be formed in a shape shown at the coordinates (0, 0) in FIG. 17 regardless of the position (image height) of the pixel array unit 51. Alternatively, as in the first embodiment, the orientation angle of the transmission axis can be adjusted according to the image height. In a case of a combination with the first embodiment, in the 45° pixel and the 90° pixel in one block disposed in coordinates (5, 0), the orientation angle of the transmission axis is adjusted, as in the case described with reference to FIG. 10.

The orientation angle of the transmission axis of the 45° pixel of the polarization member 126 disposed at coordinates (5, 0) is adjusted to be an angle smaller than the orientation angle of the 45° reference transmission axis, and the wire grid is formed in the curved shape.

The orientation angle of the transmission axis of the 135° pixel of the polarization member 126 disposed at coordinates (5, 0) is adjusted to be an angle larger than the orientation angle of the 135° reference transmission axis, and the wire grid is formed in the curved shape.

The orientation angle of the transmission axis of the 45° pixel of the polarization member 126 disposed at coordinates (10, 0) is adjusted to be an angle smaller than the orientation angle of the 45° reference transmission axis, and the wire grid is formed in the curved shape.

The orientation angle of the transmission axis of the 135° pixel of the polarization member 126 disposed at coordinates (10, 0) is adjusted to be an angle larger than the orientation angle of the 135° reference transmission axis, and the wire grid is formed in the curved shape. Referring to FIG. 18, the transmission axis of the polarization member 126 disposed at coordinates (0, 45) is the same as the transmission axis of the polarization member 126 disposed at coordinates (0, 0) in FIG. 17.

The orientation angle of the transmission axis of the 0° pixel of the polarization member 126 disposed at coordinates (5, 45) is adjusted to be an angle larger than the orientation angle of the 0° reference transmission axis, and the wire grid is formed in the curved shape.

The orientation angle of the transmission axis of the 90° pixel of the polarization member 126 disposed at coordinates (5, 45) is adjusted to be an angle smaller than the orientation angle of the 90° reference transmission axis, and the wire grid is formed in the curved shape.

The orientation angle of the transmission axis of the 0° pixel of the polarization member 126 disposed at coordinates (10, 45) is adjusted to be an angle larger than the orientation angle of the 0° reference transmission axis, and the wire grid is formed in the curved shape.

The orientation angle of the transmission axis of the 90° pixel of the polarization member 126 disposed at coordinates (10, 45) is adjusted to be an angle smaller than the orientation angle of the 90° reference transmission axis, and the wire grid is formed in the curved shape.

The orientation of the transmission axis of the polarization member 126 disposed at another coordinate is also adjusted according to the image height, and the wire grid is formed in the curved shape. By forming the polarization member 126 in this manner, it is possible to prevent the extinction ratio from decreasing in a case where the F-number is small.

Fifth Embodiment

Figure 19:
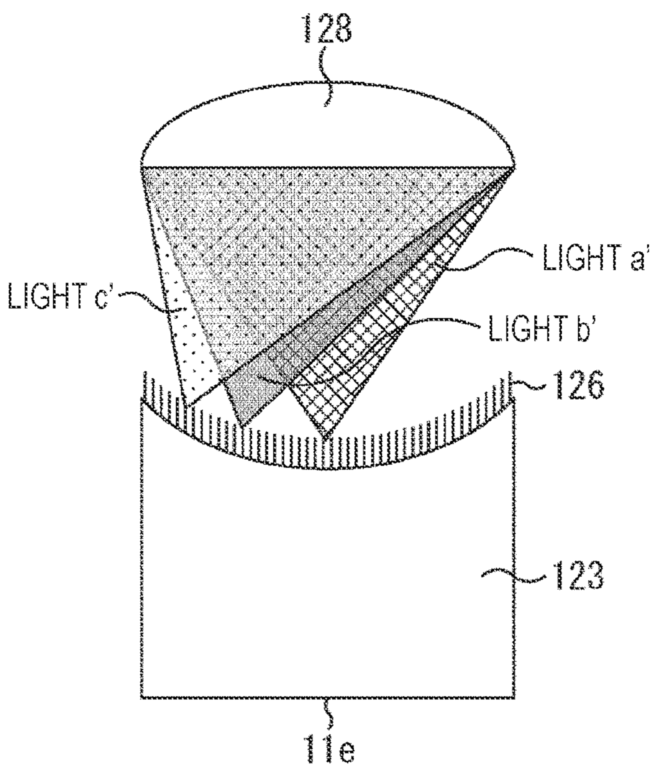
FIG. 19 is a diagram illustrating a configuration example of an imaging element according to a fifth embodiment.

FIG. 19 is a diagram illustrating a configuration of an imaging element 11*e* according to the fifth embodiment. FIG. 19 illustrates one pixel 50 disposed in the pixel array unit 51.

The light receiving surface side of one pixel 50 is formed in a curved shape. The light receiving surface side of the photoelectric conversion element 123 is formed in the curved shape and the polarization member 126 stacked on the photoelectric conversion element 123 is also formed in the curved shape. Therefore, similarly to the imaging element 11*d* according to the fourth embodiment, it is possible to obtain a structure in which the extinction ratio can be prevented from decreasing in a case where the F-number is small.

As in the case described with reference to FIG. 16, the light a vertically incident on the on-chip microlens 128 is condensed as the light a' of the photoelectric conversion element 123 and condensed on the spot a, and thus, the light a is also incident on the polarization member 126 in the vertical direction.

The light b incident on the on-chip microlens 128 in an oblique direction is condensed as the light b' and condensed on the spot b of the photoelectric conversion element 123. Therefore, when the polarization member 126 is not formed in the curved shape, there is a possibility that the extinction ratio decreases. Since the polarization member 126 of the imaging element 11*e* according to the fifth embodiment is formed in the curved shape, it is possible to prevent the light b' from being vertically incident on the polarization member 126 and the extinction ratio from decreasing.

The light c incident on the on-chip microlens 128 in the oblique direction and incident in a direction more oblique than that of the light b is condensed as the light c' and condensed on the spot c of the photoelectric conversion element 123. Therefore, when the polarization member 126 is not formed in the curved shape, there is a possibility that the extinction ratio decreases. Since the polarization member 126 of the imaging element 11*e* according to the fifth embodiment is formed in the curved shape, it is possible to prevent the light c' from being vertically incident on the polarization member 126 and the extinction ratio from decreasing.

The light receiving surface of each of the pixels 50 disposed in the pixel array unit 51 is formed in the curved shape. By forming the polarization member 126 in this manner, it is possible to prevent the extinction ratio from decreasing in a case where the F-number is small.

In a case where the polarization member 126 of each pixel 50 is formed in the curved shape, the polarization member 126 having the same polarization angle may be disposed regardless of the position of the pixel array unit 51 as described with reference to FIG. 5 (regardless of the image height). Alternatively, as described with reference to FIG. 10, the polarization member 126 of which the orientation angle is adjusted by using the image height may be disposed. In this case, the adjustment of the orientation angle can be finely performed, and the correction amount can be reduced.

In a case of a combination with the fourth embodiment, the wire grid of the polarization member 126 may be formed in the curved shape.

The above-described first to fifth embodiments can be appropriately combined.

In the above-described actual aspect, an example in which one block includes the 0° pixel, the 45° pixel, the 90° pixel, and the 135° pixel, and is disposed in the pixel array unit 51 has been described, but the present technology can also be applied to, for example, a case where only the 0° pixel is disposed in the pixel array unit 51. The present technology can be applied to an imaging element that acquires one or a plurality of pieces of polarization information.

<Imaging Apparatus>

Figure 20:
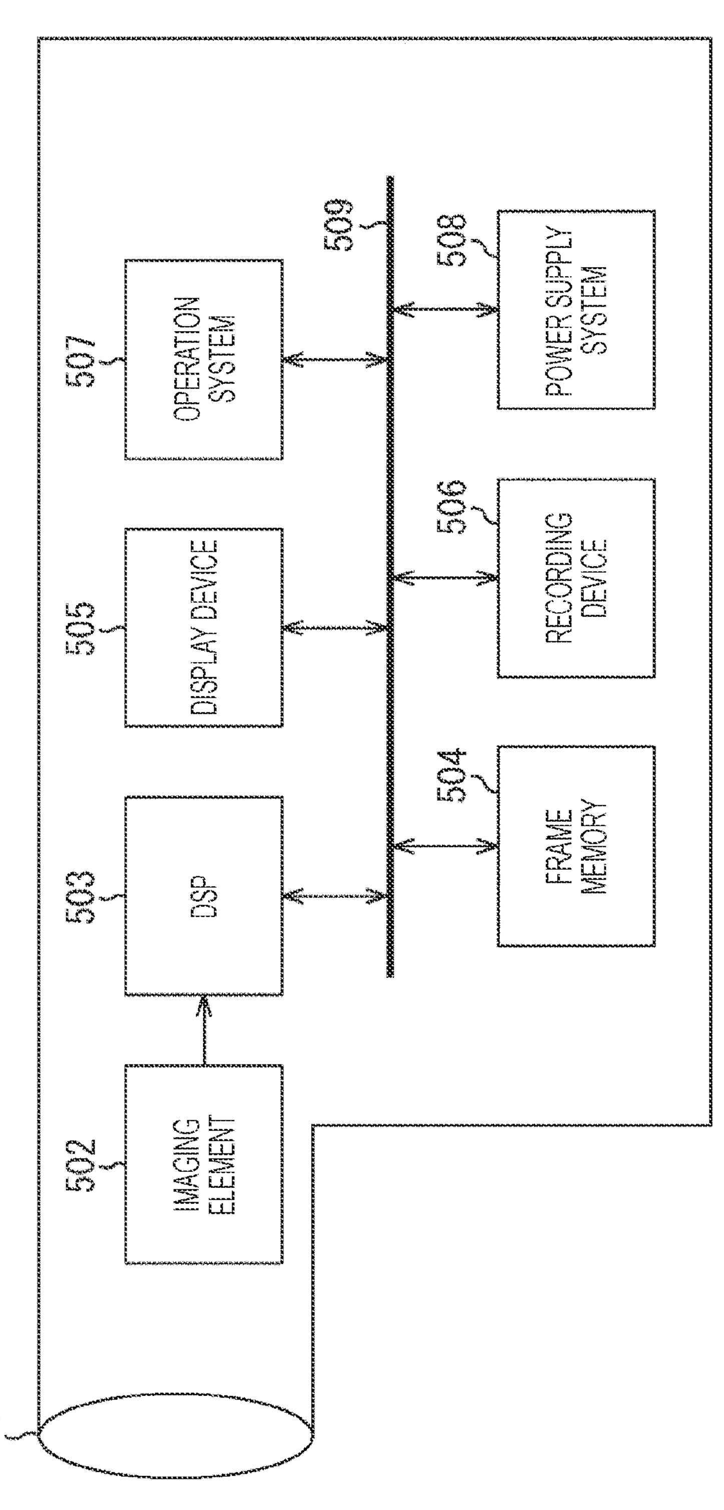
FIG. 20 is a diagram illustrating a configuration example of an electronic apparatus.

FIG. 20 is a block diagram illustrating a configuration example of the imaging apparatus as an example of the electronic apparatus to which the present technology is applied.

As illustrated in FIG. 20, the imaging apparatus includes an optical system including a lens group 501, an imaging element 502, a DSP circuit 503 serving as a camera signal processing unit, a frame memory 504, a display device 505, a recording device 506, an operation system 507, and a power supply system 508. Then, the DSP circuit 503, the frame memory 504, the display device 505, the recording device 506, the operation system 507, and the power supply system 508 are connected to each other via a bus line 509.

The lens group 501 captures incident light (image light) from a subject and forms an image on an imaging surface of the imaging element 502. The imaging element 502 converts the amount of incident light, which is formed into an image on the imaging surface by the lens group 501, into an electric signal in units of pixels and outputs the electric signal as a pixel signal.

The display device 505 includes a panel display device such as a liquid crystal display device and an organic electro luminescence (EL) display device, and displays a moving image or a still image captured by the imaging element 502. The recording device 506 records the moving image or the still image captured by the imaging element 502 on a recording medium such as a memory card, a video tape, or a digital versatile disk (DVD).

The operation system 507 issues operation commands for various functions of the imaging apparatus according to an operation performed by a user. The power supply system 508 appropriately supplies various power, which are operation power for the DSP circuit 503, the frame memory 504, the display device 505, the recording device 506, and the operation system 507, to these power supply targets.

The imaging device is applied to a video camera, a digital still camera, and a camera module for a mobile device such as a smartphone and a mobile phone. Then, in this imaging apparatus, as the imaging element 502, the imaging element 11 according to the above-described embodiments (imaging device 1 including the imaging element 11) can be used.

<Application Example to Mobile Body>

The technology according to the present disclosure (present technology) can be applied to various products. For example, the technology according to the present disclosure may be realized as a device mounted on any type of mobile objects, such as an automobile, an electric vehicle, a hybrid electric vehicle, a motorcycle, a bicycle, personal mobility, an airplane, a drone, a ship, a robot, and the like.

FIG. 21 is a block diagram illustrating a schematic configuration example of a vehicle control system as an example of a mobile body control system to which the technology according to the present disclosure is applied.

The vehicle control system 12000 includes a plurality of electronic control units connected to each other via a communication network 12001. In the example illustrated in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
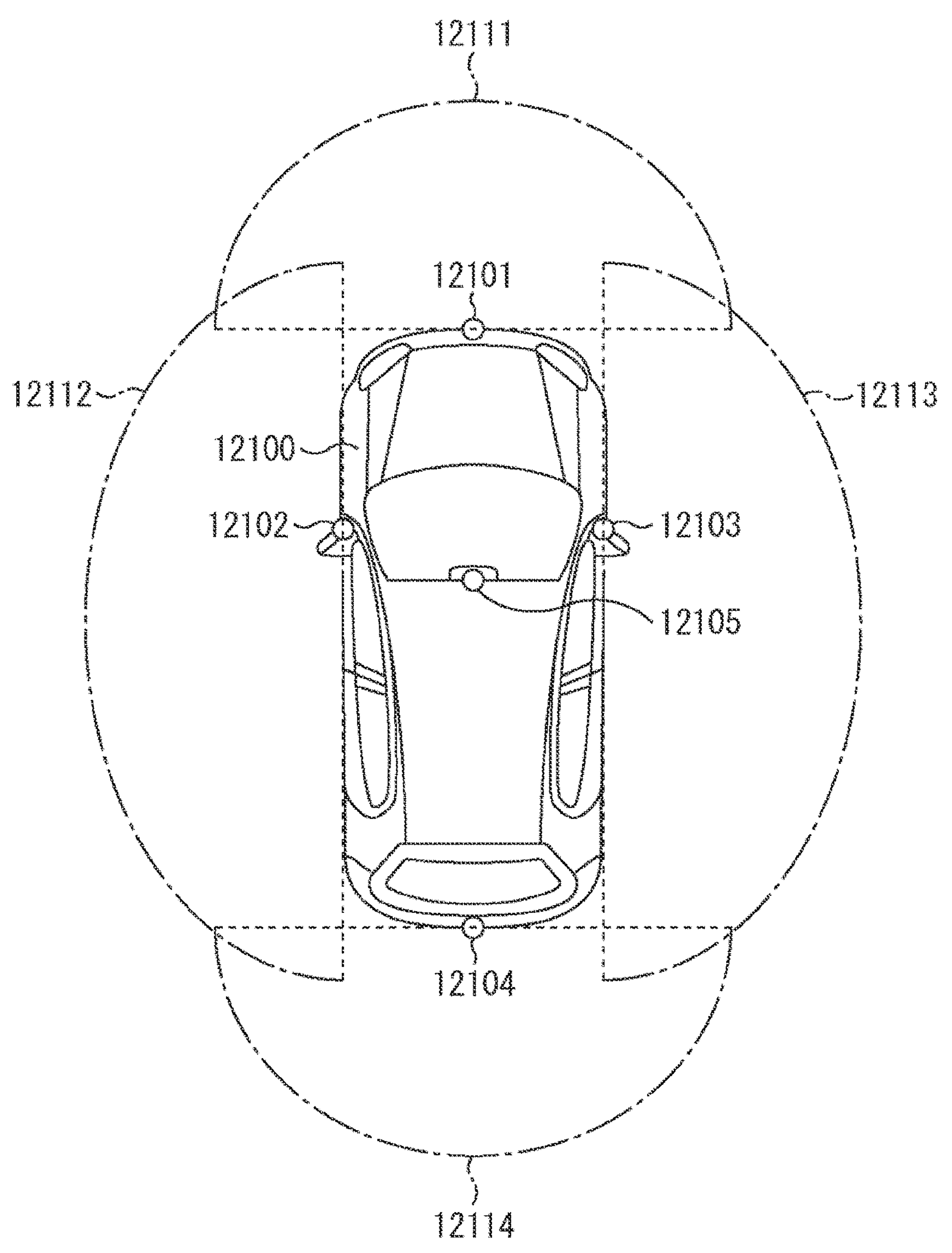
FIG. 22 is an explanatory view illustrating an example of installation positions of an outside-vehicle information detecting section and an imaging section.

FIG. 22 is a diagram illustrating an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 22 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The embodiments of the present technology are not limited to the above-described embodiments, and various modifications can be made without departing from the gist of the present technology.

Furthermore, effects described in the present description are merely examples and are not limited, and there may be other effects.

Note that the present disclosure is not limited to the above-described embodiments, and various modifications can be made without departing from the gist of the present disclosure.

Furthermore, the effects described in the present description are merely examples and are not limited, and other effects may be provided.

Note that the present technology can also have the following configuration.

(1)

An imaging element including a pixel array unit in which a pixel, which includes a polarization member having a polarization direction, and a photoelectric conversion unit configured to receive light transmitted through the polarization member, is disposed in a row direction and a column direction to form a lattice pattern, in which an orientation angle of the polarization member varies depending on a position of the pixel array unit.

(2)

The imaging element according to (1), in which the polarization member is formed by a wire grid, and the orientation angle of the wire grid varies depending on the position of the pixel array unit.

(3)

The imaging element according to (1) or (2), in which a correction amount of the orientation angle of the polarization member is set according to an incident angle of incident light incident on the photoelectric conversion unit.

(4)

The imaging element according to any one of (1) to (3), in which the orientation angle of the polarization member located at a center of the pixel array unit is set to a reference, and the correction amount of the orientation angle of the polarization member increases as a distance from a center of the pixel array unit increases.

(5)

The imaging element according to any one of (1) to (4), in which a block, in which the polarization members having angles of transmission axes different from each other by 45° are disposed in two rows and two columns, is disposed in a row direction and column direction to form a lattice pattern.

(6)

The imaging element according to (5), in which in four pixels included in the block, the orientation angle of the polarization member of a pixel at a position where an orientation from a center of the pixel array unit and an angle of the transmission axis of the polarization member are in a relationship of 0° or 90° is a same as the angle of the transmission axis, and the orientation angle of the polarization member of the pixel at a position which is not in the relationship of 0° or 90° is an angle corrected with a correction amount corresponding to an image height.

(7)

The imaging element according to any one of (1) to (6), in which the orientation angle of the polarization member is an angle at which a crossed-Nicols state for incident light is maintained.

(8)

The imaging element according to any one of (2) to (7), in which the wire grid is formed in a curved shape.

(9)

An electronic apparatus including:

an imaging element including a pixel array unit in which a pixel, which includes a polarization member having a polarization direction, and a photoelectric conversion unit configured to receive light transmitted through the polarization member, is disposed in a row direction and a column direction to form a lattice pattern, in which an orientation angle of the polarization member varies depending on a position of the pixel array unit; and a processing unit configured to process a signal from the imaging element.

(10)

An imaging element including:

a polarization member formed by a wire grid having a polarization direction; and a photoelectric conversion unit configured to receive light transmitted through the polarization member, in which the wire grid is formed in a curved shape.

(11)

The imaging element according to (10), in which the wire grid is formed in the curved shape in a center direction of a pixel.

(12)

The imaging element according to (10) or (11), further including a pixel array unit in which a pixel, which includes the polarization member and the photoelectric conversion unit, is disposed in a row direction and a column direction to form a lattice pattern, in which an orientation angle of the polarization member varies depending on a position of the pixel array unit.

(13)

An electronic apparatus including:

an imaging element including a polarization member formed by a wire grid having a polarization direction, and a photoelectric conversion unit configured to receive light transmitted through the polarization member, in which the wire grid is formed in a curved shape; and a processing unit configured to process a signal from the imaging element.

REFERENCE SIGNS LIST

1 Imaging device
11 Imaging element
12 Metal wire
13 Circuit board
14 Spacer
15 Adhesive
16 Lens
17 Actuator
50 Pixel
51 Pixel array unit
52 Vertical driving unit
53 Column processing unit
54 Horizontal driving unit
55 System control unit
56 Pixel drive line
57 Vertical signal line
58 Signal processing unit
59 Data storage unit
101 Wiring layer
102 Semiconductor substrate
121 Wire
122 Gate electrode
123 Photoelectric conversion element
124 Insulation film
125 Light shielding film
126 Polarization member
128 On-chip microlens
201 Inorganic hard mask
202 Resist mask
501 Lens group
502 Imaging element
503 DSP circuit
504 Frame memory
505 Display device
506 Recording device
507 Operation system
508 Power supply system
509 Bus line

What is claimed is:

1. An imaging element, comprising a pixel array unit in which a pixel, which includes a polarization member having a polarization direction, and a photoelectric conversion unit configured to receive light transmitted through the polarization member, is disposed in a row direction and a column direction to form a lattice pattern, wherein an orientation angle of the polarization member varies depending on a position of the pixel array unit, wherein the orientation angle of the polarization member located at a center of the pixel array unit is set to a reference, and wherein a correction amount of the orientation angle of the polarization member increases as a distance from a center of the pixel array unit increases.

2. The imaging element according to claim 1, wherein the polarization member is formed by a wire grid, and the orientation angle of the wire grid varies depending on the position of the pixel array unit.

3. The imaging element according to claim 1, wherein a correction amount of the orientation angle of the polarization member is set according to an incident angle of incident light incident on the photoelectric conversion unit.

4. The imaging element according to claim 1, wherein a block, in which the polarization members having angles of transmission axes different from each other by 45° are disposed in two rows and two columns, is disposed in a row direction and column direction to form a lattice pattern.

5. The imaging element according to claim 1, wherein the orientation angle of the polarization member is an angle at which a crossed-Nicols state for incident light is maintained.

6. The imaging element according to claim 2, wherein the wire grid is formed in a curved shape.

7. An imaging element, comprising a pixel array unit in which a pixel, which includes a polarization member having a polarization direction, and a photoelectric conversion unit configured to receive light transmitted through the polarization member, is disposed in a row direction and a column direction to form a lattice pattern, wherein an orientation angle of the polarization member varies depending on a position of the pixel array unit, wherein a block, in which the polarization members having angles of transmission axes different from each other by 45° are disposed in two rows and two columns, is disposed in a row direction and column direction to form a lattice pattern, and wherein in four pixels included in the block, the orientation angle of the polarization member of a pixel at a position where an orientation from a center of the pixel array unit and an angle of the transmission axis of the polarization member are in a relationship of 0° or 90° is a same as the angle of the transmission axis, and the orientation angle of the polarization member of the pixel at a position which is not in the relationship of 0° or 90° is an angle corrected with a correction amount corresponding to an image height.

8. The imaging element according to claim 7, wherein the orientation angle of the polarization member located at a center of the pixel array unit is set to a reference, and the correction amount of the orientation angle of the polarization member increases as a distance from a center of the pixel array unit increases.

9. An electronic apparatus, comprising:

an imaging element including a pixel array unit in which a pixel, which includes a polarization member having a polarization direction, and a photoelectric conversion unit configured to receive light transmitted through the polarization member, is disposed in a row direction and a column direction to form a lattice pattern, in which an orientation angle of the polarization member varies depending on a position of the pixel array unit, wherein the orientation angle of the polarization member located at a center of the pixel array unit is set to a reference, and wherein a correction amount of the orientation angle of the polarization member increases as a distance from a center of the pixel array unit increases; and a processing unit configured to process a signal from the imaging element.

10. An imaging element, comprising:

an array of photoelectric conversion elements formed in a semiconductor substrate, wherein a light incident surface of the semiconductor substrate is formed in a curved shape;

a polarization member formed by a wire grid having a polarization direction, wherein the polarization member is disposed adjacent the light incident surface of the semiconductor substrate, wherein the photoelectric conversion elements are configured to receive light transmitted through the polarization member, and wherein the wire grid is formed in a curved shape that follows the curved shape of the light incident surface of the semiconductor substrate.

11. The imaging element according to claim 10, wherein the wire grid is formed in the curved shape in a center direction of a pixel.

12. The imaging element according to claim 10, further comprising a pixel array unit in which pixels, which each include the polarization member and a photoelectric conversion unit included in the array of photoelectric conversion units, are disposed in a row direction and a column direction to form a lattice pattern, wherein, for any one of the pixels in the pixel array unit, an orientation angle of the polarization member varies depending on a position of the pixel within the pixel array unit.

13. The imaging element according to claim 10, wherein the imaging element is provided as part of an electronic apparatus that includes the imaging element and a processing unit configured to process a signal from the imaging element.

14. The imaging element according to claim 10, wherein the polarization member is disposed on the light incident surface of the semiconductor surface.

15. The imaging element according to claim 10, further comprising:

an insulation film, wherein insulation film is between the polarization member and the light incident surface of the semiconductor substrate.

* * * * *